: US009899244B2

(12) United States Patent
Kishita

(10) Patent No.: US 9,899,244 B2
(45) Date of Patent: Feb. 20, 2018

(54) LIQUID PROCESSING APPARATUS, LIQUID PROCESSING METHOD, AND STORAGE MEDIUM

(71) Applicant: Tokyo Electron Limited, Tokyo (JP)

(72) Inventor: Naofumi Kishita, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 844 days.

(21) Appl. No.: 14/301,514

(22) Filed: Jun. 11, 2014

(65) Prior Publication Data

US 2014/0370199 A1    Dec. 18, 2014

(30) Foreign Application Priority Data

Jun. 12, 2013  (JP) ................. 2013-123922

(51) Int. Cl.
  B05B 3/02    (2006.01)
  B05C 13/00   (2006.01)
  B05D 1/02    (2006.01)
  H01L 21/67   (2006.01)
  G03F 7/16    (2006.01)

(52) U.S. Cl.
  CPC .......... *H01L 21/6715* (2013.01); *G03F 7/162* (2013.01)

(58) Field of Classification Search
  CPC ............................ G03F 7/162; H01L 21/6715
  USPC ................... 427/424, 427.2, 427.3
  See application file for complete search history.

(56) References Cited

U.S. PATENT DOCUMENTS

| | | | | |
|---|---|---|---|---|
| 2,006 A | * | 3/1841 | Ishikawa et al. | .... A43D 3/1416 12/119.5 |
| 5,002,008 A | * | 3/1991 | Ushijima | .............. B05B 15/025 118/302 |
| 6,270,579 B1 | | 8/2001 | Subramanian | |
| 6,541,184 B1 | | 4/2003 | Subramanian | |

FOREIGN PATENT DOCUMENTS

| | | |
|---|---|---|
| JP | 2010-034210 A | 2/2010 |
| JP | 2011-014849 A | 1/2011 |
| JP | 2012-054406 A | 3/2012 |
| KR | 10-2011-0004278 A | 1/2011 |
| KR | 10-1152569 B1 | 5/2012 |

* cited by examiner

*Primary Examiner* — Alexander M Weddle
(74) *Attorney, Agent, or Firm* — Pearne & Gordon LLP

(57) ABSTRACT

A liquid processing apparatus includes multiple substrate holding units each configured to horizontally hold a substrate and arranged in a left/right direction; a moving unit that is spaced from an arrangement of the substrate holding units in a forward/backward direction and is moved in the left/right direction; a nozzle standby unit, provided between a movement path of the moving unit and the arrangement of the substrate holding units, at which a nozzle that supplies a processing liquid to the substrate held by the substrate holding unit is on standby; and a rotatable arm having one end at which a nozzle holding unit that detachably holds the nozzle and the other end rotatably provided at the moving unit. The nozzle is transferred between the nozzle standby unit and a supply position where the processing liquid is supplied to the substrate together by the moving unit and the rotatable arm.

9 Claims, 28 Drawing Sheets

LIQUID PROCESSING APPARATUS, LIQUID PROCESSING METHOD, AND STORAGE MEDIUM

CROSS-REFERENCE TO RELATED APPLICATION

This application claims the benefit of Japanese Patent Application No. 2013-123922 filed on Jun. 12, 2013, the disclosures of which are incorporated herein by reference.

TECHNICAL FIELD

The embodiments described herein pertain generally to a liquid processing apparatus and a liquid processing method of supplying a processing liquid to a substrate and performing a liquid process, and a storage medium that stores a computer program for implementing the liquid processing method.

BACKGROUND

In a photolithography process of a semiconductor manufacturing process, a liquid processing apparatus supplies a processing liquid such as a resist liquid to a surface of a semiconductor wafer (hereinafter, referred to as "wafer") as a substrate and performs a process. In the liquid processing apparatus, to increase a throughput, multiple cups each including a substrate holding unit therein may be provided and wafers may be processed in the respective cups in parallel. Further, to reduce manufacturing cost of the apparatus, the multiple cups share a nozzle and the nozzle is moved between the multiple cups by a transfer device. Patent Document 1 describes such a liquid processing apparatus.

In recent years, an increase in diameter of the wafer to 450 mm has been considered. If a diameter of the wafer is increased as such, the liquid processing apparatus needs to be increased in size accordingly. However, an installation space for the liquid processing apparatus is limited. Under this circumstance, it has been demanded a liquid processing apparatus that has a size not greater than the apparatus described in Patent Document 1. Further, even if a wafer having a diameter, for example, 300 mm, smaller than 450 mm is used, it is still required to limit the size of the apparatus for the installation space.

In Patent Document 2, there is illustrated a liquid processing apparatus in which an arm constituting a nozzle transfer device receives a nozzle selected from a nozzle group, which is on standby at a nozzle standby unit, to perform a process. The arm is provided together with the nozzle standby unit on a rotatable table. Further, by rotating the rotatable table, the arm performs a process toward two cups alternately. However, there is a limit to a range in which the arm can be accessed by the rotation, and, thus, the number of cups provided corresponding to each arm is limited. Furthermore, if the standby unit of the nozzle group is moved, all flexible lines connected to the nozzle group on standby and configured to supply the processing liquid to the nozzle group may be frequently contacted with the bottom or other parts of the apparatus while the standby unit is moved. As a result, the respective lines may be deteriorated quickly.

In Patent Document 3, there is illustrated a liquid processing apparatus in which a standby unit where a nozzle group is on standby is moved along an arrangement direction of cups and positioned in front of the cups that perform a process on a substrate, and a multi-joint arm receives a nozzle from the standby unit positioned as such. Like the apparatus described in Patent Document 2, the apparatus described in Patent Document 3 also has a problem that when the standby unit is moved, a line connected to the nozzle group may be contacted with the apparatus. In order to suppress a life of the line from being shortened, in the liquid processing apparatus, it has been required to suppress the line from being bent and thus suppress a load applied to the line.

Patent Document 1: Japanese Patent Laid-open Publication No. 2011-014849

Patent Document 2: Japanese Patent Laid-open Publication No. 2012-054406

Patent Document 3: Japanese Patent Laid-open Publication No. 2010-034210 (FIG. 8)

SUMMARY

In view of the foregoing, example embodiments provide a liquid processing apparatus including multiple substrate holding units, and the liquid processing apparatus is suppressed from being increased in size and a load applied to a line for supplying a processing liquid to a nozzle is suppressed.

In one example embodiment, a liquid processing apparatus includes multiple substrate holding units each configured to horizontally hold a substrate and arranged in a left/right direction; a moving unit that is provided to be spaced from an arrangement of the substrate holding units in a forward/backward direction and is configured to be moved in the left/right direction; a nozzle standby unit, provided between a movement path of the moving unit and the arrangement of the substrate holding units, at which at least one nozzle configured to supply a processing liquid to the substrate held by the substrate holding unit is on standby; and a rotatable arm having one end at which a nozzle holding unit configured to detachably hold the at least one nozzle and the other end rotatably provided at the moving unit. Further, the at least one nozzle is transferred between the nozzle standby unit and a supply position where the processing liquid is supplied to the substrate together by the moving unit and the rotatable arm.

In accordance with the various aspects and example embodiments, the moving unit is provided to be spaced from the arrangement of the substrate holding units in the forward/backward direction and is configured to be moved in the left/right direction. Further, the other end of the horizontally rotatable arm is provided at the moving unit, and the nozzle standby unit is provided between a movement path of the moving unit and the arrangement of the substrate holding units. Thus, it is not necessary to provide the nozzle standby unit in the arrangement direction of cups. As a result, the arrangement length thereof can be suppressed and an increase in size of the apparatus can be suppressed. Further, since the nozzle is transferred by rotating the rotation unit, a direction of a line connected to the nozzle can be changed. Thus, it is possible to suppress the line from being greatly bent due to the transfer of the nozzle, and thus, possible to suppress a load applied to the line.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
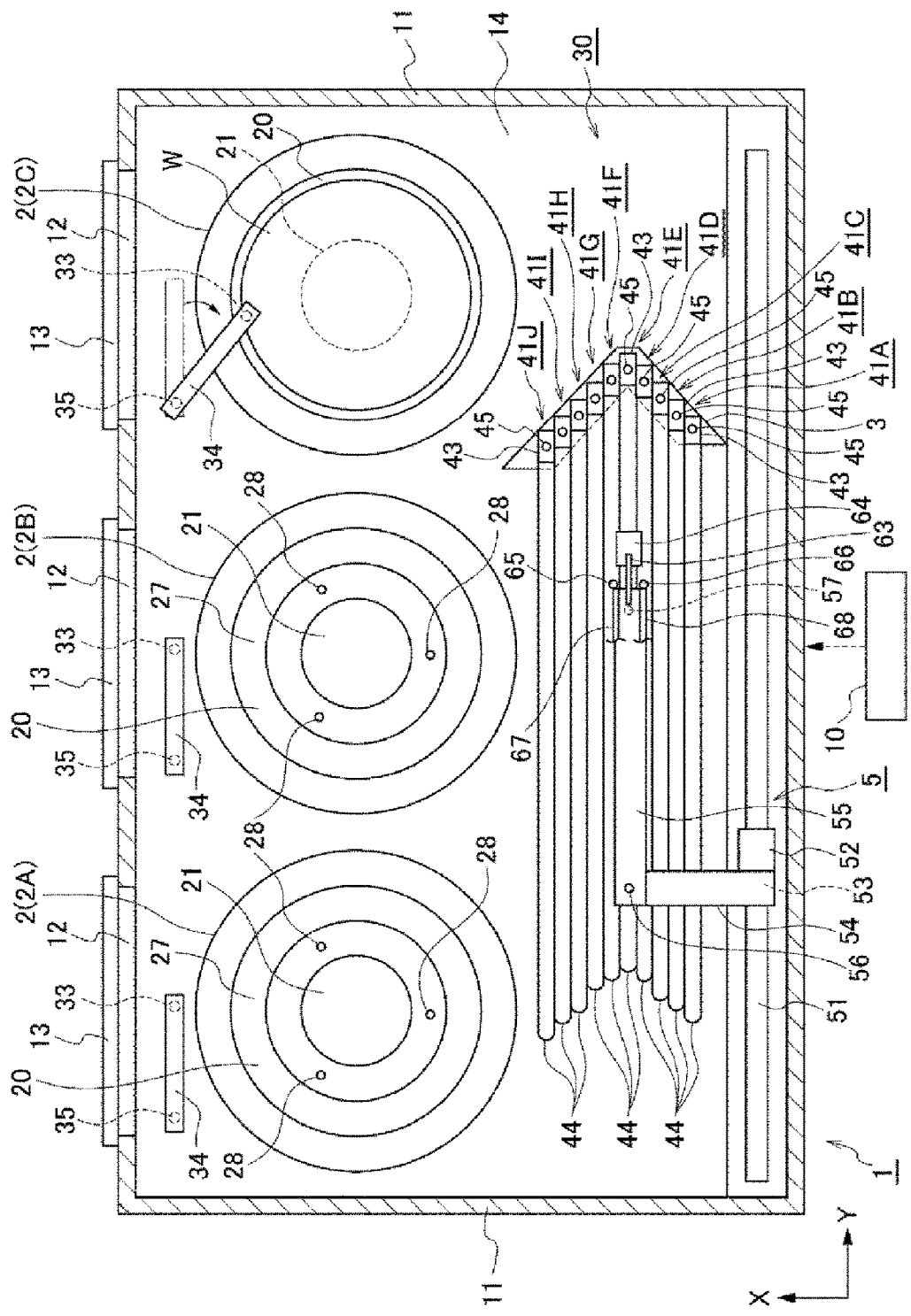
FIG. 1 is a plane view illustrating a resist coating apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
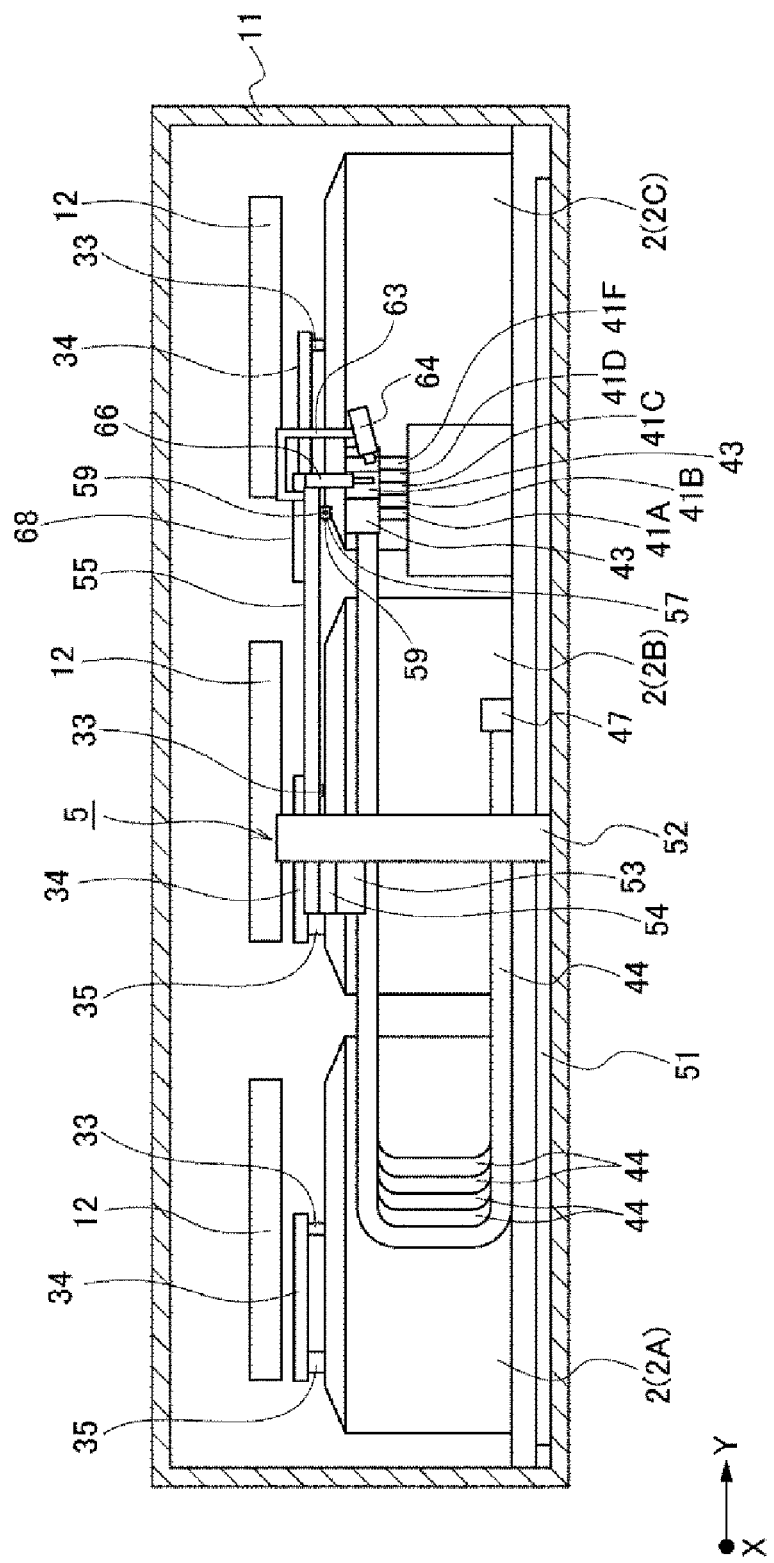
FIG. 2 is a longitudinal side view of the resist coating apparatus.

A resist coating apparatus 1 as an example embodiment of a liquid processing apparatus will be explained with reference to the accompanying drawings. FIG. 1 and FIG. 2 are a plane view and a longitudinal side view of the resist coating apparatus 1, respectively. The resist coating apparatus 1 includes a housing 11 and three cups 2 horizontally arranged in a straight line within the housing 11. At a sidewall of the housing 11, three transfer openings 12 through which substrates, i.e. wafers W, are transferred into the respective cups 2 are formed. The respective transfer openings 12 are opened and closed by vertically movable shutters 13.

Figure 3:
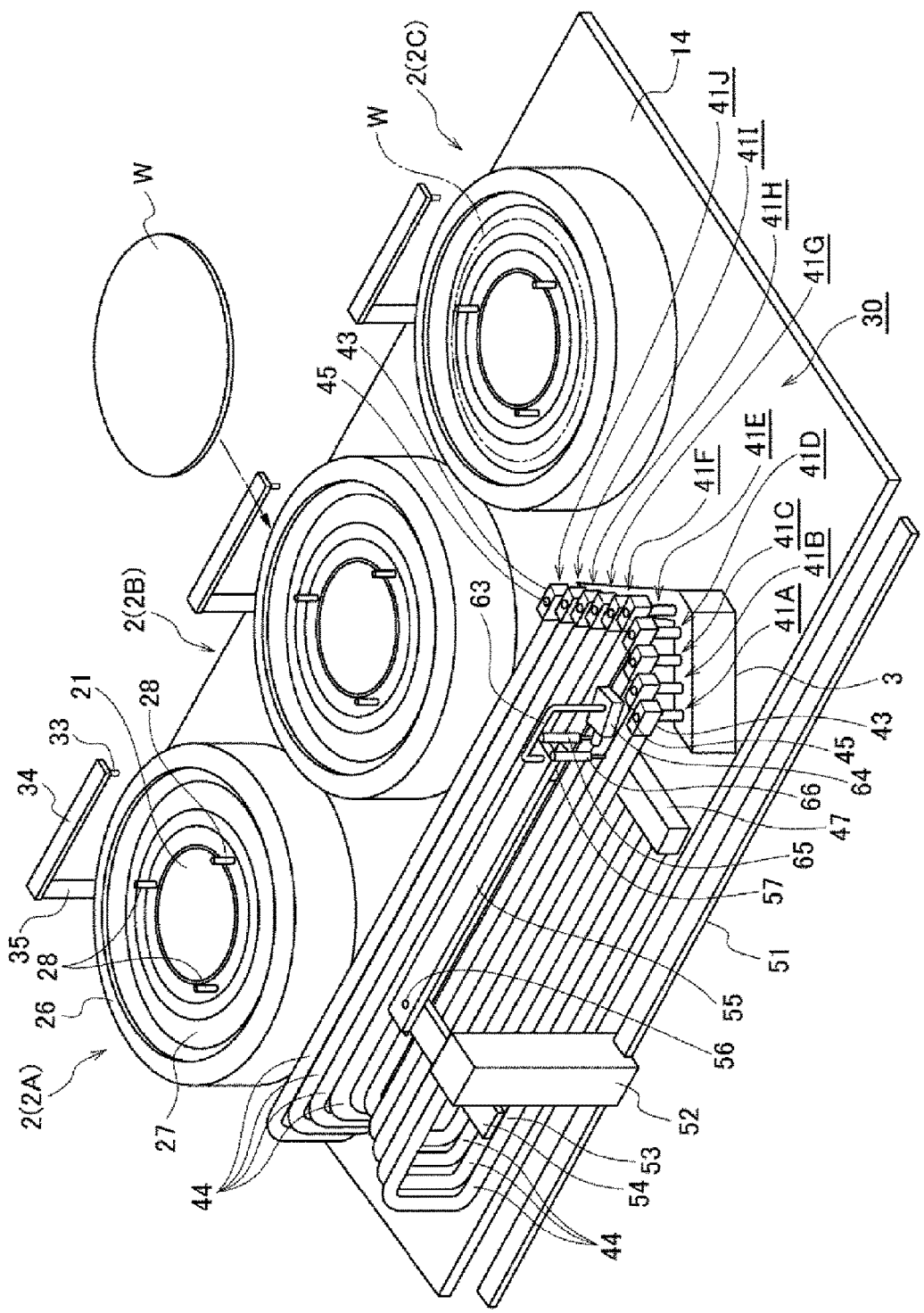
FIG. 3 is a perspective view of the resist coating apparatus.

FIG. 3 is a perspective view illustrating respective parts within the housing 11. Within the housing 11, a base member 14 is provided, and the cups 2 are provided on the base member 14. When viewed from an inner side (rear side) within the housing 11 toward a front side (transfer openings 12' side) within the housing 11, the cup in the left, the cup in the middle, and the cup in the right may be referred to as 2A, 2B, and 2C, respectively. For convenience of explanation, an arrangement direction of the cups 2 is referred to as a left/right direction (indicated as a Y direction in FIG. 1). Further, a horizontal direction perpendicular to the Y direction is referred to as a forward/backward direction (indicated as an X direction in FIG. 1).

Figure 4:
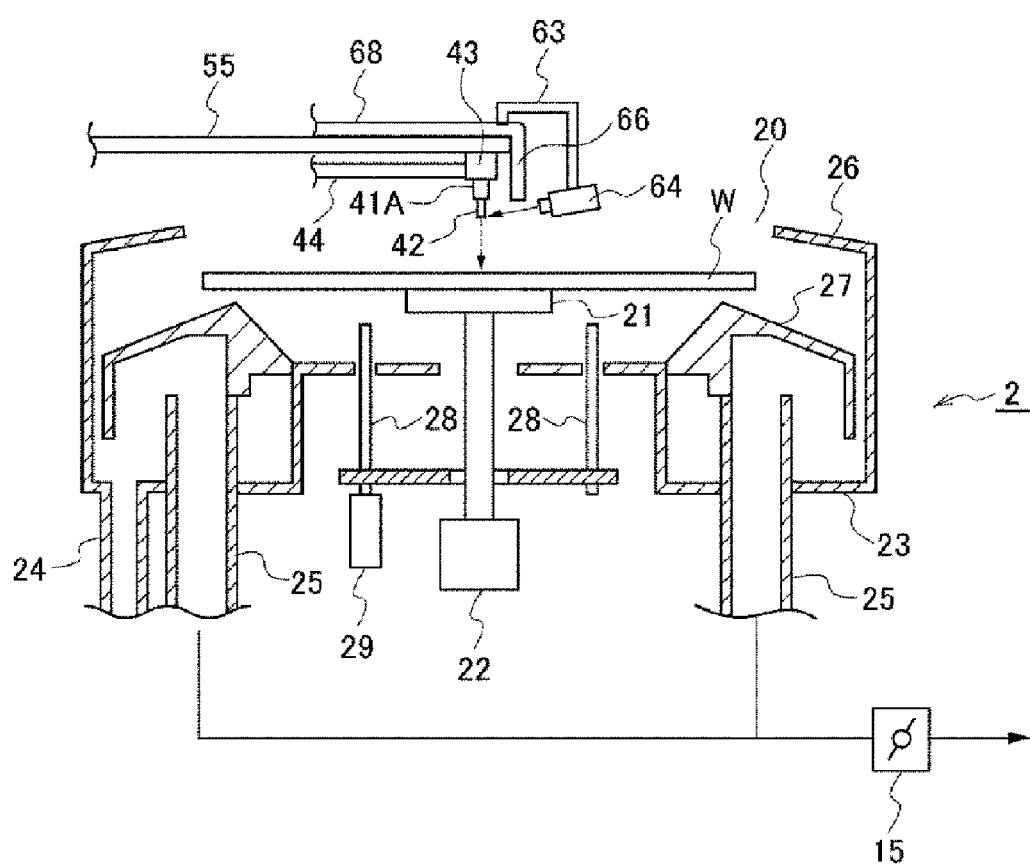
FIG. 4 is a longitudinal side view of a cup provided in the resist coating apparatus.

Each of the cups 2 has the same configuration, and FIG. 4 is a longitudinal side view of the cup 2. The cup 2 has an upper opening 20, and includes a spin chuck 21 serving as a substrate holding unit therein. The spin chuck 21 is configured to attract a central portion of a rear surface of the wafer W and horizontally hold the wafer W. The spin chuck 21 is connected to a rotational driving unit 22, and the rotational driving unit 22 is configured to rotate the spin chuck 21 and the wafer W around a vertical axis. A resist liquid is supplied to a central portion of a front surface of the wafer W from a resist discharge nozzle 41 to be described later. The resist liquid is spread to a peripheral portion of the wafer W by a centrifugal force caused by the rotation thereof. A resist film is formed on the front surface of the wafer W by so-called spin coating.

The cup 2 receives a waste liquid dispersed from or overflowing/falling from the rotating wafer W when the resist film is formed as such, and also serves as a guide to drain out the waste liquid to the outside of the resist coating apparatus 1. A lower portion of the cup 2, having a recess shape and serving as an annular liquid-receiving portion 23, is connected to a liquid drain path 24. A reference numeral 25 in the drawings denotes an exhaust line that separates a gas and a liquid by a sidewall of the exhaust line 25. A reference numeral 15 in the drawings denotes a damper that is provided at the exhaust line 25 and configured to control a flow rate of an exhaust gas.

A reference numeral 26 in the drawings denotes an inclined wall extended toward an upper and inner side of the cup 2. A reference numeral 27 in the drawings denotes a guide member including an inclined surface that is positioned under the wafer W and lowered toward the outside of the wafer W. The inclined wall 26 and the guide member 27 are configured to guide the waste liquid to the liquid-receiving portion 23. The cup 2 includes three pins 28 (only two of which are illustrated in FIG. 4) and an elevating unit 29 configured to elevate the pins 28. These pins 28 deliver the wafer W between a non-illustrated transfer device of transferring the wafer W and the spin chuck 21.

Figure 5:
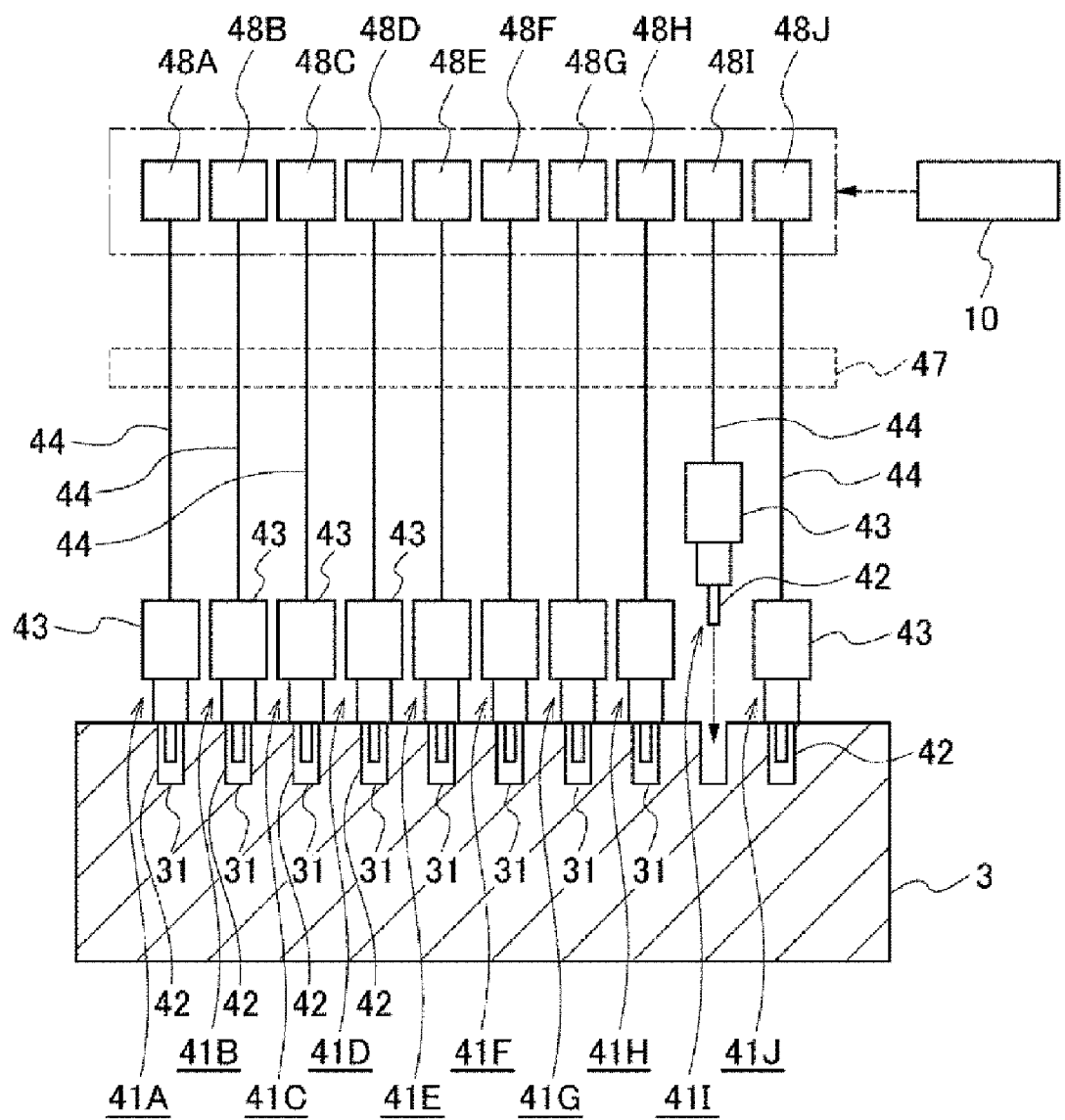
FIG. 5 is a longitudinal side view of a nozzle standby unit provided in the resist coating apparatus.

In a rear region 30 positioned at an external and rear side of the cup 2, a nozzle standby unit 3 is provided and fixed on the base member 14. That is, the nozzle standby unit 3 is fixed with respect to each spin chuck 21. Since the nozzle standby unit 3 is fixed, it is possible to avoid the problem that lines of resist discharge nozzles 41 (41A to 41J) on standby are bent or contacted with respective parts of the resist coating apparatus 1 while moving the nozzle standby unit 3, as described above in BACKGROUND. As a result, a decrease in life of the apparatus can be suppressed. Further, it is not necessary to provide a moving device for moving the nozzle standby unit 3, so that the apparatus can be decreased in size. In this example embodiment, the nozzle standby unit 3 has a V-shape when viewed from the plane, and is arranged such that a tip of the V shape faces toward the right side in FIG. 1 and FIG. 2. FIG. 5 is a longitudinal side view of the nozzle standby unit 3. At an upper portion of the nozzle standby unit 3, ten standby holes 31 are arranged with a space from each other, for example, along a configuration of the nozzle standby unit 3, i.e., along the V shape. Front ends 42 of the resist discharge nozzles 41A to 41J are introduced into the respective standby holes 31, and these nozzles 41A to 41J are on standby.

In the resist coating apparatus 1, one resist discharge nozzle selected from the resist discharge nozzles 41 is held by a nozzle transfer device 5 to be described later, and then, transferred between the cups 2A and 2C to perform the resist coating process on the wafers W in the respective cups 2A to 2C. While the resist discharge nozzle is held by the nozzle transfer device 5 as such, the remaining nine resist discharge nozzles are on standby at the nozzle standby unit 3. During the standby state, non-illustrated thinner supply units provided within the standby holes 31 supply a thinner to the front ends 42 of the resist discharge nozzles, and a nozzle cleaning process is performed. Further, a discharge (dummy dispense) for adjusting a status of the resist liquid supplied to the wafer W through the resist discharge nozzles on standby is performed. The discharged resist liquid is removed through a non-illustrated liquid drain path connected to the standby holes 31.

Figure 6:
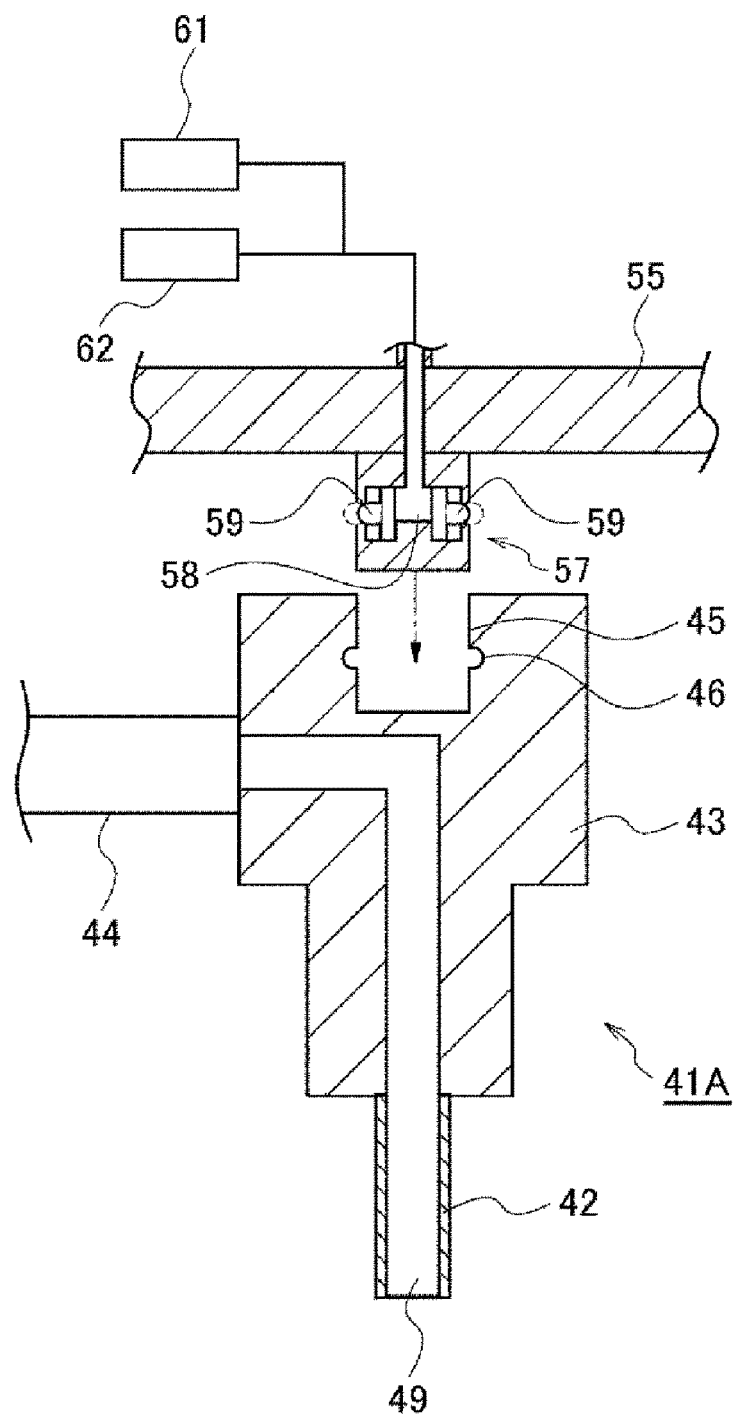
FIG. 6 is a longitudinal side view of a resist discharge nozzle and a nozzle holding unit provided in the resist coating apparatus.

The resist discharge nozzles 41 will be explained with reference to FIG. 6. Each of the resist discharge nozzles 41A to 41J has the same configuration, and FIG. 6 illustrates the resist discharge nozzle 41A. As described above, each of the resist discharge nozzles 41 includes the front end 42, and the resist liquid is discharged vertically downwards from a discharge opening 49 formed at the front end 42. An upper portion of the front end 42 constitutes a main body 43 held by the nozzle transfer device 5. While the resist discharge nozzle 41 is on standby at the nozzle standby unit 3, the main body 43 is positioned above the nozzle standby unit 3 and can be received by the nozzle transfer device 5 as described below. The main body 43 and the front end 42 are made of hard materials as compared with a line 44.

In FIG. 2, from a left side of the main body 43 on standby, one end of the flexible line 44 is connected to the main body 43. In the main body 43, there is formed a flow path for supplying the resist liquid to the front end through the line 44. Further, at an upper portion of the main body 43 above the discharge opening 49, there is formed a circular transfer recess 45 as a holding target portion. Furthermore, at a sidewall of the transfer recess 45, multiple engagement grooves 46 are formed along a circumference of the transfer recess 45.

As depicted in FIG. 2, an upstream side of each of the lines 44 is extended toward a left side of the resist discharge nozzle 41, and then, extended toward a down side and a right side thereof, and then, fixed on the base member 14. A reference numeral 47 in FIG. 2 is a fixing member configured to fix the upstream side as such. That is, at a downstream side of the fixing member 47, the line 44 is configured to be bent. As depicted in FIG. 5, upstream ends of the lines 44 are respectively connected to resist liquid supply devices 48A to 48J, respectively. In FIG. 2 and FIG. 3, illustration of the line 44 at an upstream side of the fixing member 47 is omitted.

When the resist discharge nozzles 41 are on standby at the nozzle standby unit 3 as such, the lines 44 are extended in the Y direction from the resist discharge nozzles 41, i.e., in parallel with the arrangement direction of the spin chucks 21. With this configuration, the respective lines 44 are arranged in a small space at the rear region 30 of the cups 2, and, thus, it is possible to suppress an increase in size of the apparatus 1. Further, the lines 44 connected to the resist discharge nozzles, which do not perform a process on the wafer W, are not bent around a vertical axis so that the life of the lines 44 can be lengthened.

Each of the resist liquid supply devices 48A to 48J includes a resist liquid reservoir, a pump configured to supply the resist liquid in the reservoir toward a downstream side, and a valve and a mass flow controller configured to control a flow rate of the resist liquid. In response to a control signal outputted from a control unit 10 to be described later, the supply of the resist liquid from the supply devices 48A to 48J through the resist discharge nozzles 41A to 41J are independently controlled. In the respective reservoirs of the resist liquid supply devices 48A to 48J, resist liquids different from each other may be reserved. That is, the resist discharge nozzles 41A to 41J may supply these different resist liquids to the wafer W.

Then, the nozzle transfer device 5 provided in the resist coating apparatus 1 will be explained. The nozzle transfer device 5 includes a guide rail 51, a horizontal moving unit 52, a vertical moving unit 53, a forward/backward extendable arm 54, and a rotatable arm 55. The guide rail 51 is linearly provided along the left/right direction at a rear side of the nozzle standby unit 3, and the horizontal moving unit 52 is configured to be moved in the left/right direction along the guide rail 51. The vertical moving unit 53 is provided to be vertically moved at a side portion of the horizontal moving unit 52. Further, the forward/backward extendable arm 54 is provided to be extended from above the vertical moving unit 53 toward the front side within the housing 11. On a front end of the forward/backward extendable arm 54, a base end of the rotatable arm 55 is provided.

The rotatable arm 55 is horizontally extended from the front end of the forward/backward extendable arm 54. At a base end of the rotatable arm 55, a rotation shaft 56 is vertically provided (see FIG. 1 and FIG. 3). The rotatable arm 55 is configured to be rotated around the rotation shaft 56. As described below, since the rotatable arm 55 is rotated counterclockwise when viewed from the plane, the rotatable arm 55 transfers the resist discharge nozzle 41 from the rear region 30 of the cup 2 toward the cup 2 in which a process is performed on the wafer W.

At a front end side of a rear surface of the rotatable arm 55, a nozzle holding unit 57 is provided. The nozzle holding unit 57 is configured as a cylindrical protrusion. Referring to FIG. 6, a space 58 is formed within the nozzle holding unit 57. Further, at a sidewall of the nozzle holding unit 57, multiple engagement protrusions 59, which can be protruded and recessed form a surface of the sidewall depending on a pressure in the space 58, are provided in a circumference direction. In FIG. 6, only two engagement protrusions 9 are illustrated.

In FIG. 6, reference numerals 61 and 62 denote a gas supply unit that performs the supply of a gas into the space 58 and a gas exhaust unit that performs the exhaust of a gas from the space 58, respectively, in response to a control signal from the control unit 10. Accordingly, a pressure in the space 58 is adjusted, so that the engagement protrusions 59 are protruded and recessed. Other than FIG. 6, illustration of the gas supply unit 61 and the gas exhaust unit 62 is omitted. While the engagement protrusions 59 are recessed from the surface of the sidewall of the nozzle holding unit 57, the nozzle holding unit 57 is introduced into the transfer recess 45 of the resist discharge nozzle 41 and is retreated from the transfer recess 45. While the nozzle holding unit 57 is introduced into the transfer recess 45, the engagement protrusions 59 are protruded from the surface of the sidewall of the nozzle holding unit 57 and engaged with the engagement grooves 46. Thus, the rotatable arm 55 can hold the resist discharge nozzles 41A to 41J. FIG. 4 illustrates a status where the rotatable arm 55 holds the resist discharge nozzle 41A.

As depicted in FIG. 4, at a front end portion of the rotatable arm 55, there is provided a camera supporting unit 63 that is extended in a lengthwise direction of the rotatable arm 55. A camera 64 is provided at the rotatable arm 55 via the camera supporting unit 63. As indicated by a dotted arrow in FIG. 4, an optical axis of the camera 64 is directed obliquely downwards with respect to the rotatable arm 55, and the camera 64 can capture an image of the front end 42 of the resist discharge nozzle 41 held by the rotatable arm 55 and lower regions thereof. The control unit 10 to be described later acquires the image from the camera 64 after the discharge of the resist liquid to the wafer W through the resist discharge nozzle 41 is ended. Then, the control unit 10 determines whether a liquid drips from the resist discharge nozzle 41 based on the image.

At a front end of the rotatable arm 55, a nozzle 65 and a nozzle 66 are provided. These nozzles 65 and 66 are arranged with a space therebetween in a width direction of the rotatable arm 55 in order not to interrupt the image capture of the camera 64. These nozzles 65 and 66 respectively discharge a thinner and pure water vertically downwards. The thinner and pure water (so-called pre-wet liquids) are supplied to the wafer W in order to increase a wetting property of the wafer W with respect to the resist liquid before the resist liquid is supplied to the wafer W. Any one of the thinner and the pure water may be supplied to the wafer W. In FIG. 1, reference numerals 67 and 68 denote lines connected to the nozzles 65 and 66, and upstream sides thereof are connected to non-illustrated thinner supply source and pure water supply source, respectively.

In FIG. 1 to FIG. 3, a reference numeral 33 denotes a film removal nozzle that is configured to remove a resist film formed at a peripheral portion of the wafer W by discharging a thinner to the peripheral portion of the wafer W and provided at each of the cups 2. A reference numeral 34 denotes an arm of which a front end portion supports the film removal nozzle 33. A reference numeral 35 is a rotation unit that is provided at a base portion of the arm 34 and configured to rotate the arm 34 around a vertical axis. The film removal nozzle 33 is retreated at the outside of the cup 2 except when the thinner is being discharged.

In the resist coating apparatus 1, the control unit 10 configured as a computer is provided. The control unit 10 includes a non-illustrated program storage unit. The program storage unit stores a program comprised of, for example, software including instructions for implementing a resist coating process to be described later. When this program is read out by the control unit 10, the control unit 10 outputs a control signal to each of components of the resist coating apparatus 1. Accordingly, operations such as delivery of the wafer W by the pins 28 between the wafer transfer device and the cup 2, transfer of the resist discharge nozzle 41, discharge of the resist liquid, the thinner, and the pure water, image capture by the camera 64, and determination on whether a liquid drips or not are carried out. Therefore, a resist coating process can be performed on the wafer W as described below. This program is stored in the program storage unit while being recorded in a storage medium such as a hard disc, a compact disc, a magnet-optical disc, or a memory card.

By way of example, in the resist coating apparatus 1, a process is performed on the wafers W transferred to the cups 2 in sequence. Further, a user of the resist coating apparatus 1 may determine, for example, which one of the resist discharge nozzles 41A to 41J performs a process on each lot of the wafers W, via a non-illustrated manipulation unit provided in the control unit 10. Further, the user may determine which one of the thinner or the pure water is used for the pre-wet process to each lot of the wafers W.

Figure 7:
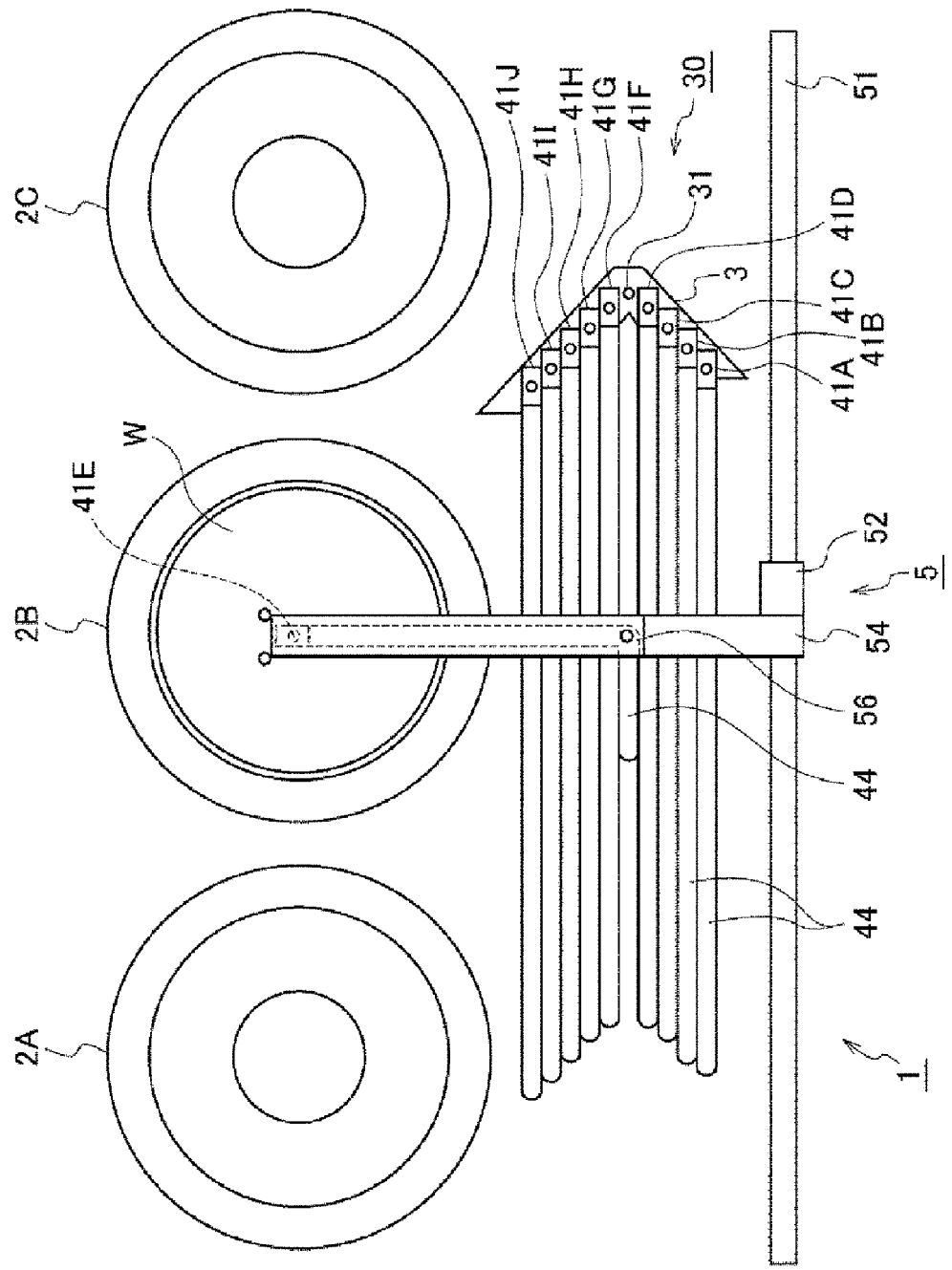
FIG. 7 is an explanatory diagram of an operation of the resist coating apparatus.
Figure 8:
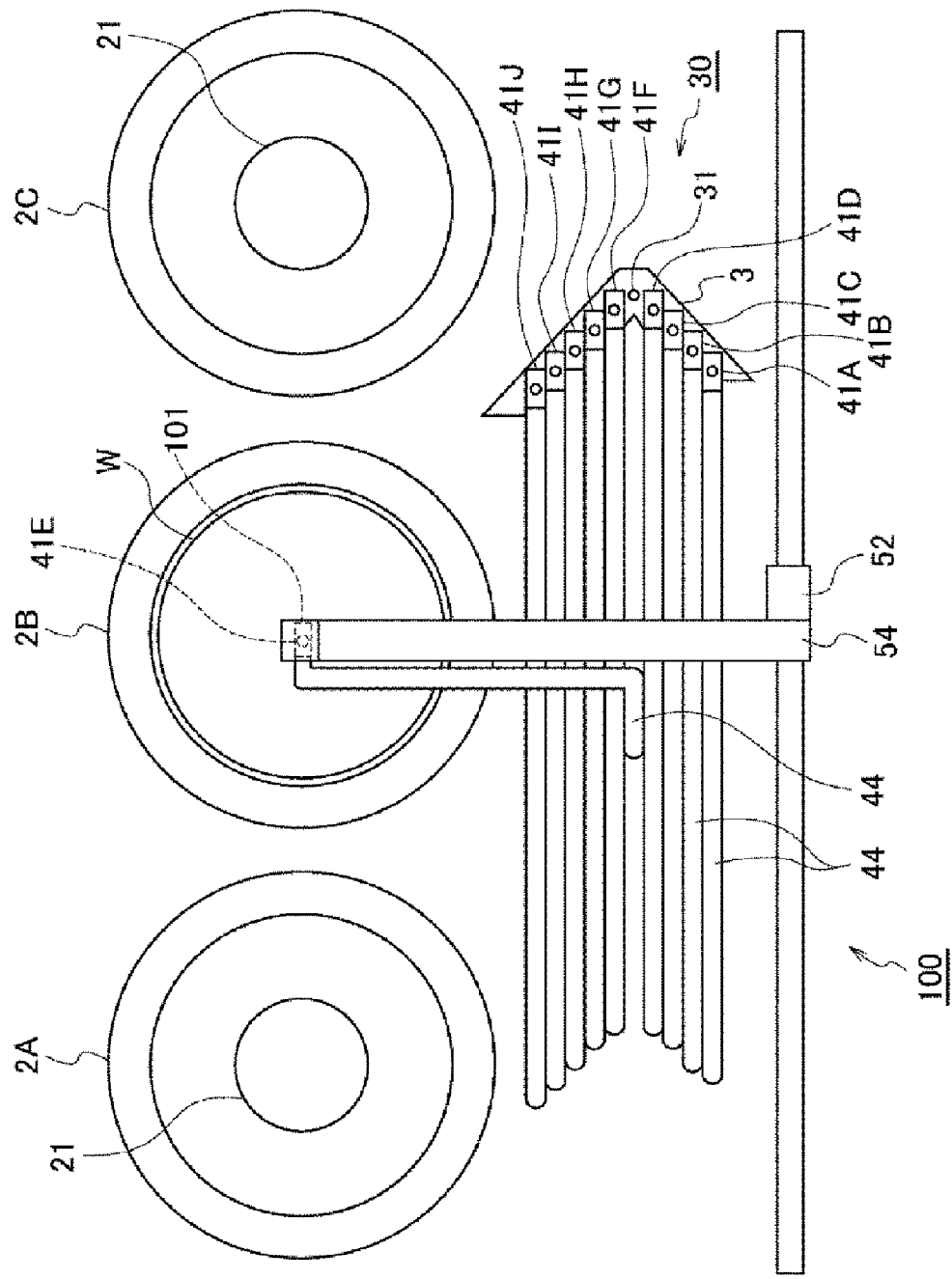
FIG. 8 is an explanatory diagram of an operation of a resist coating apparatus in accordance with a comparative example.

In the resist coating apparatus 1, each of the resist discharge nozzles 41A to 41J is transferred from the nozzle standby unit 3 to a resist liquid discharge position above a central portion of the wafer W in each of the cups 2 by the combination of a vertical movement of the vertical moving unit 53, a horizontal movement of the horizontal moving unit 52, and a rotation of the rotatable arm 55. FIG. 7 illustrates, for example, a status where the resist discharge nozzle 41E is transferred to a position above a central portion of the wafer W in the cup 2B. FIG. 8 illustrates a resist coating apparatus 100 in accordance with a comparative example to explain an advantage of the resist coating apparatus 1. The resist coating apparatus 100 is different from the resist coating apparatus 1 in that the rotatable arm 55 is not provided, the relatively long forward/backward extendable arm 54 is extended toward the front side, and a moving unit 101 is moved under the forward/backward extendable arm 54 in the forward/backward direction, and the nozzle holding unit 57 is provided at the moving unit 101. With this configuration, in the resist coating apparatus 100, each of the resist discharge nozzles 41A to 41J is transferred from the nozzle standby unit 3 to the position above the central portion of the wafer W in each of the cups 2 in the same manner as the resist coating apparatus 1. However, between when the resist discharge nozzles 41A to 41J are on standby and when each of the resist discharge nozzles 41A to 41J is transferred to above the cups 2, each of the resist discharge nozzles 41A to 41J does not rotate around the vertical axis. Like FIG. 7, FIG. 8 illustrates a status where the resist discharge nozzle 41E is transferred to the position above the central portion of the wafer W in the cup 2B.

As described above, the lines 44 are extended from the rear sides of the cups 2 and connected to the left sides of the resist discharge nozzles 41A to 41J on standby. Therefore, in the resist coating apparatus 100, as depicted in FIG. 8, when the resist discharge nozzles 41 are transferred to the cups 2, the lines 44 are bent relatively greatly toward the rear region at the vicinity of the resist discharge nozzle 41. Therefore, a load applied to the lines 44 is increased, and a life of the lines 44 is shortened. Meanwhile, as depicted in FIG. 7, in the resist coating apparatus 1, the resist discharge nozzle 41 is rotated around the rotation shaft by the rotatable arm 55 from a direction where the resist discharge nozzle 41 is on standby to be transferred to above the wafer W in the cup 2. Thus, when the resist discharge nozzle 41 is positioned above the wafer W, it is possible to suppress the line 44 from being bent at the vicinity of the resist discharge nozzle 41, and to suppress the load applied to the line 44.

Further, if the line 44 at the vicinity of the resist discharge nozzle 41 is greatly bent, bent portions thereof may be worn out, and particles generated from the bent portions due to the wear may adhere to the wafer W under the bent portions. The configuration of the resist coating apparatus 1 is effective in suppressing such a problem. As described below, the rotatable arm 55 of the resist coating apparatus 1 may be rotated in order to transfer the resist discharge nozzle 41 while detouring the wafer W in the cup 2B, and also to suppress a liquid from dripping to the wafer W in the cup 2B.

Hereinafter, referring to FIG. 9 to FIG. 20, an operation example of the resist coating apparatus 1 will be described. In this example embodiment, in the order of the cups 2A, 2C, and 2B, the wafers W in the same lot are transferred, and in the same order, a resist coating process is performed on the wafers W. Further, the user of the apparatus 1 may determine in advance that the pre-wet process is performed with the thinner and the resist discharge nozzle 41A is used. Furthermore, in the following process, based on the image captured by the camera 64, whether a liquid drips from the front end 42 of the resist discharge nozzle 41A is determined. Here, a case where it is determined that a liquid does not drip will be explained. Moreover, the camera supporting unit 63 is simply illustrated in the drawings.

Figure 9:
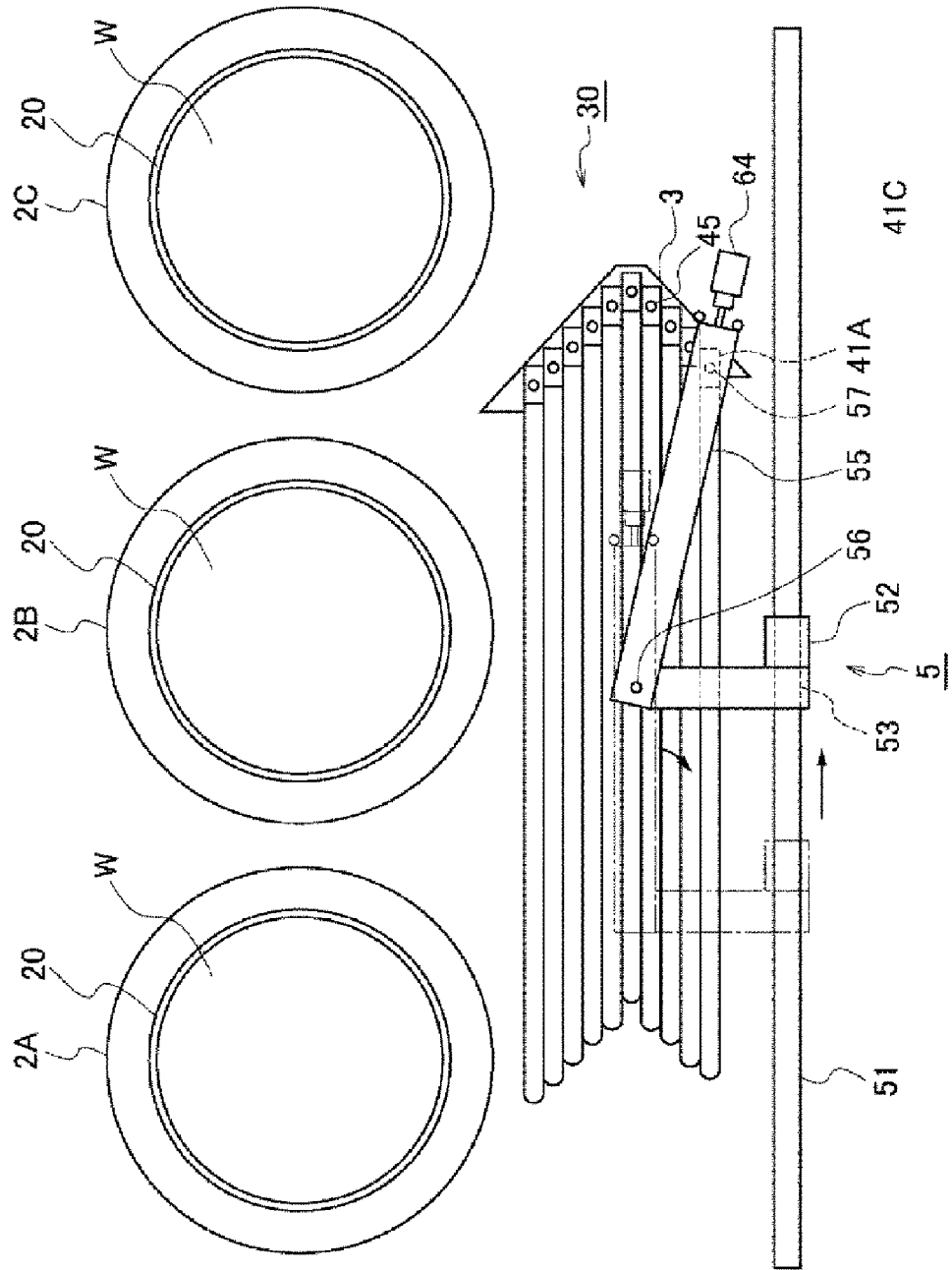
FIG. 9 is an explanatory diagram of an operation of the resist coating apparatus in accordance with the example embodiment.

By way of example, the horizontal moving unit 52 of the nozzle transfer device 5 on standby at a position indicated by a dashed dotted line in FIG. 9 is moved to a certain position. Then, the rotatable arm 55 of the nozzle transfer device 5 is rotated such that the nozzle holding unit 57 of the rotatable arm 55 is positioned above the resist discharge nozzle 41A as indicated by a solid line in FIG. 9. Thereafter, the rotatable arm 55 is moved down by the vertical moving unit 53 of the nozzle transfer device 5, so that the nozzle holding unit 57 is introduced into the transfer recess 45 of the resist discharge nozzle 41A. Then, as illustrated in FIG. 6, the engagement protrusions 59 of the nozzle holding unit 57 are engaged with the transfer recess 45, so that the resist discharge nozzle 41A is held by the rotatable arm 55.

Figure 10:
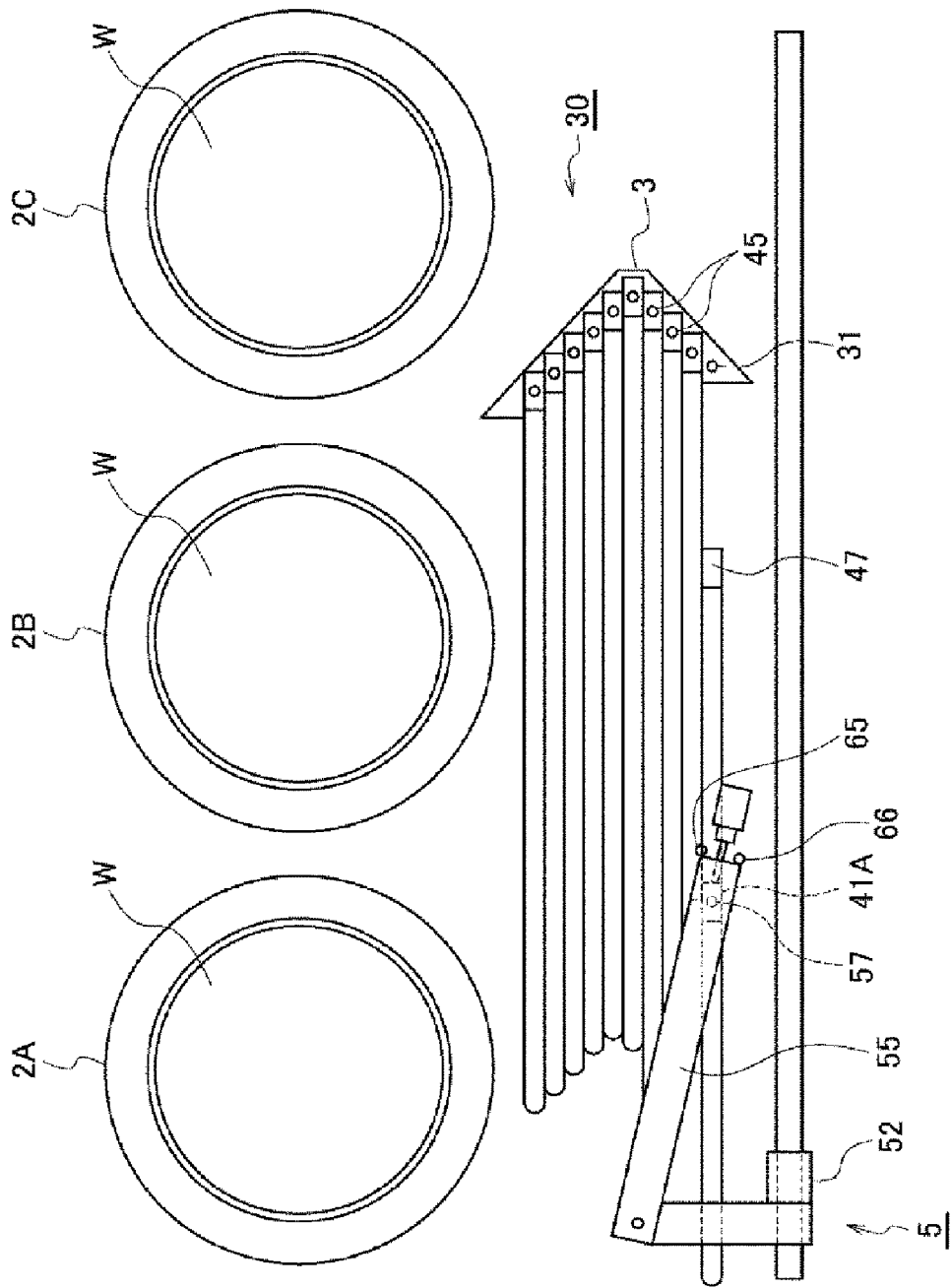
FIG. 10 is an explanatory diagram of an operation of the resist coating apparatus.
Figure 11:
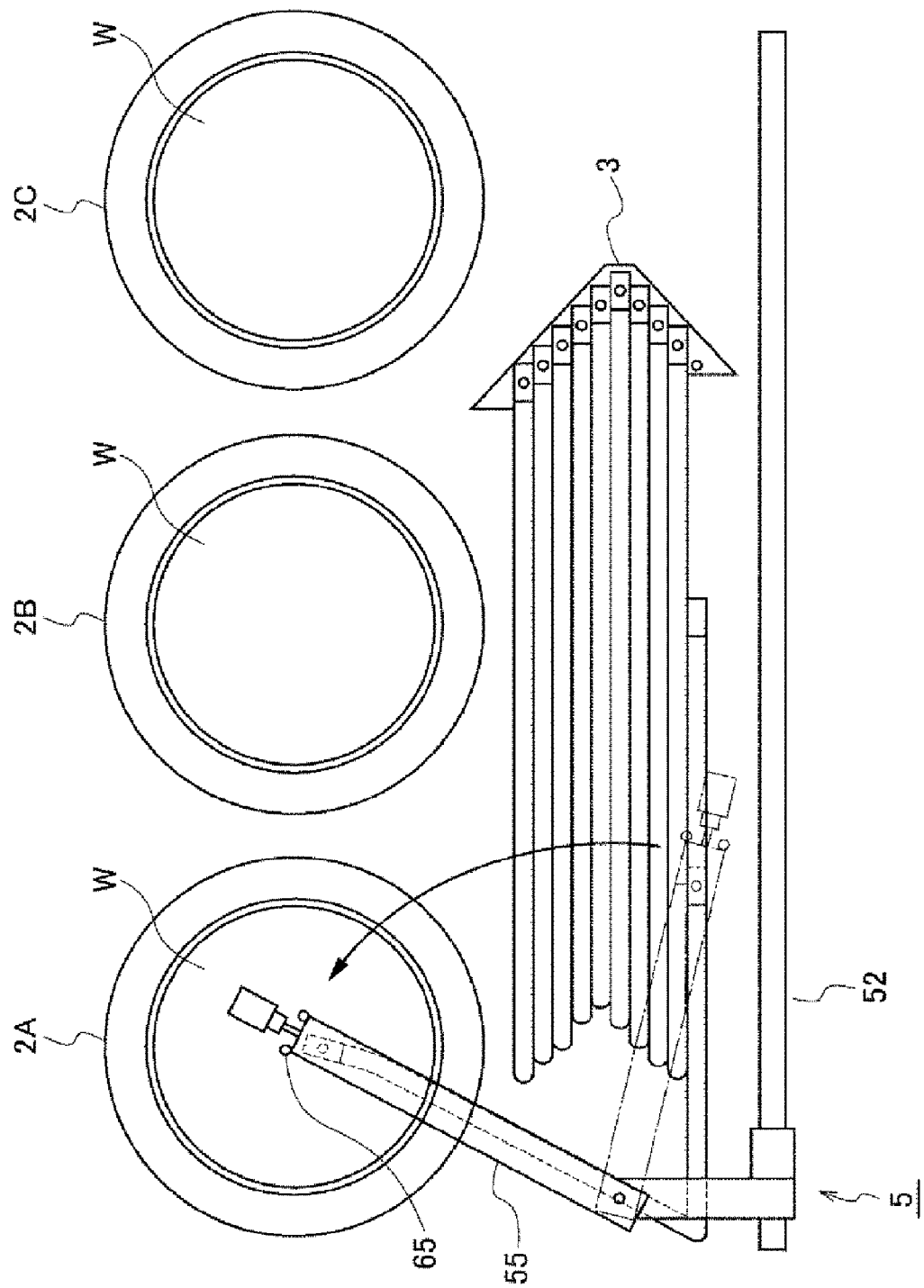
FIG. 11 is an explanatory diagram of an operation of the resist coating apparatus.
Figure 12:
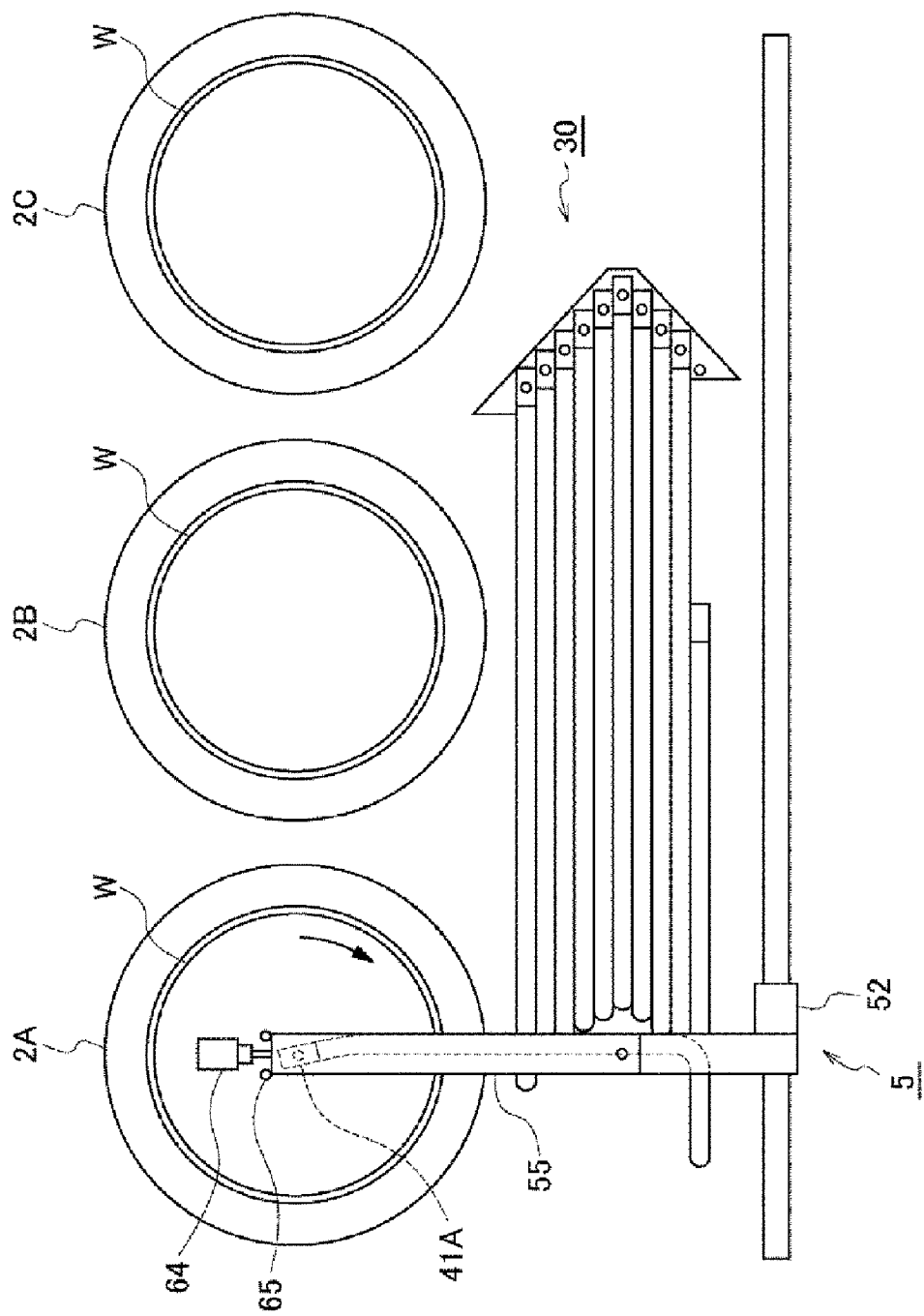
FIG. 12 is an explanatory diagram of an operation of the resist coating apparatus.

After the rotatable arm 55 is moved up and the resist discharge nozzle 41A is unloaded from the standby hole 31 of the nozzle standby unit 3, in order to perform a process on the wafer W in the cup 2A, the horizontal moving unit 52 is moved to a rear side of the cup 2A and stopped (FIG. 10). Then, when the rotatable arm 55 is rotated counterclockwise when viewed from the plane such that the thinner discharge nozzle 65 is positioned above the central portion of the wafer W, the rotation of the rotatable arm 55 is stopped (FIG. 11). When the thinner is supplied to the central portion of the wafer W through the thinner discharge nozzle 65, the wafer W is rotated and the thinner is spread to a peripheral portion of the wafer W by the centrifugal force. Together with the rotation of the wafer W, the horizontal moving unit 52 is slightly moved toward the cup 2B and the rotatable arm 55 is rotated counterclockwise when viewed from the top, so that the resist discharge nozzle 41A is positioned above the central portion of the wafer W (FIG. 12). Then, the wafer W is rotated and a resist liquid is discharged to the wafer W through the resist discharge nozzle 41A, so that the resist liquid is spread to the peripheral portion of the wafer W by the centrifugal force. Accordingly, a resist film 40 is formed.

Figure 13:
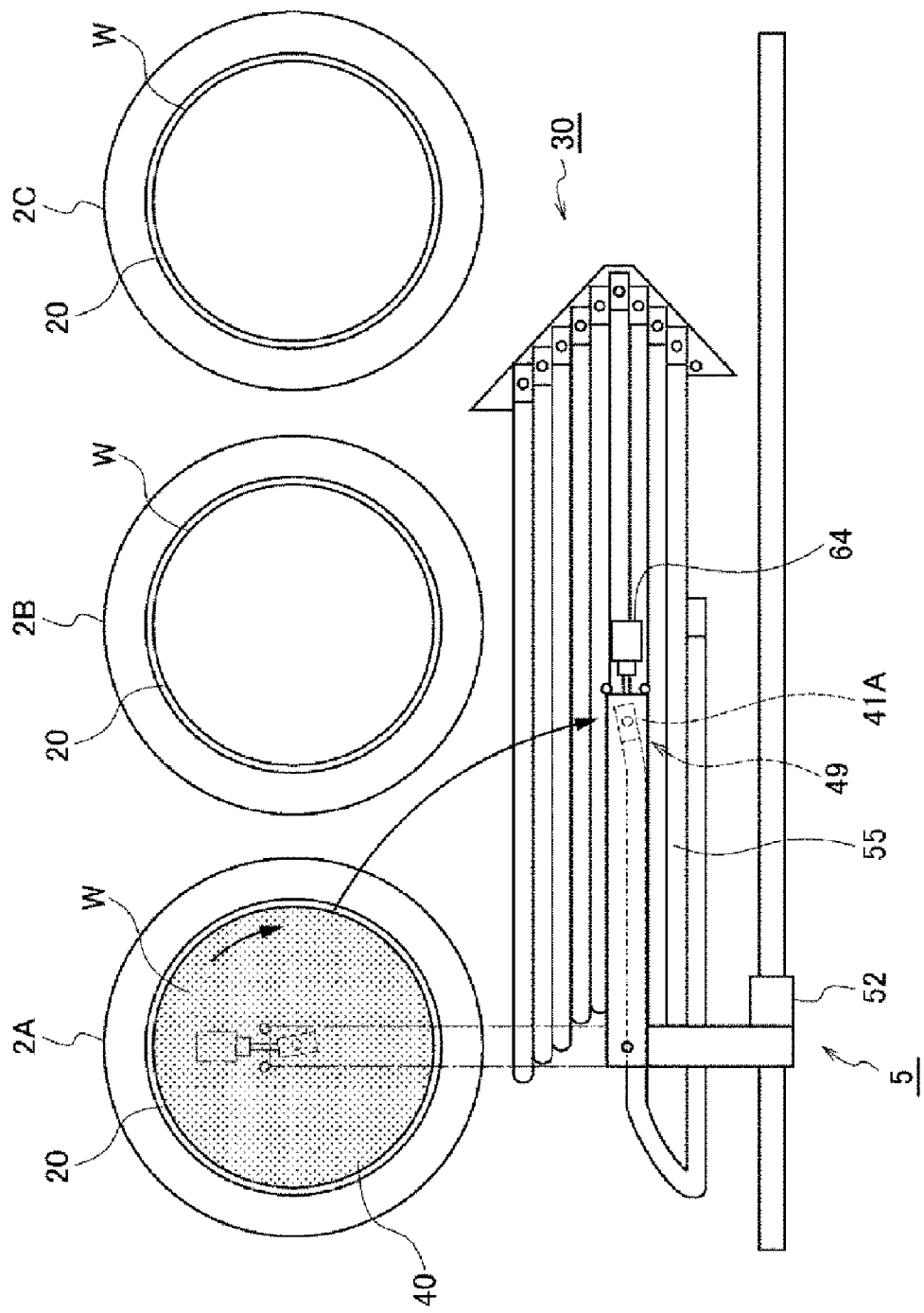
FIG. 13 is an explanatory diagram of an operation of the resist coating apparatus.
Figure 14:
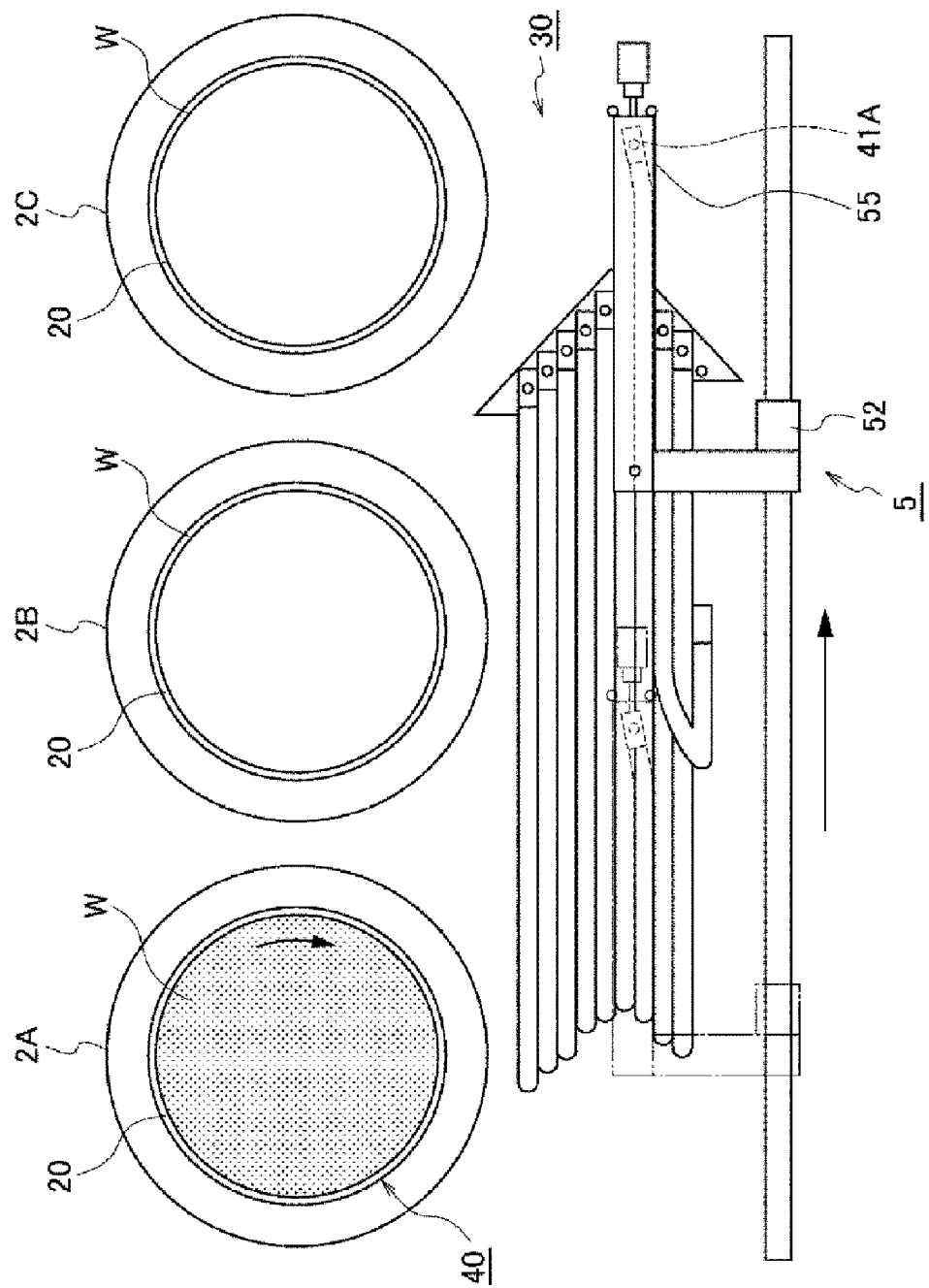
FIG. 14 is an explanatory diagram of an operation of the resist coating apparatus.
Figure 15:
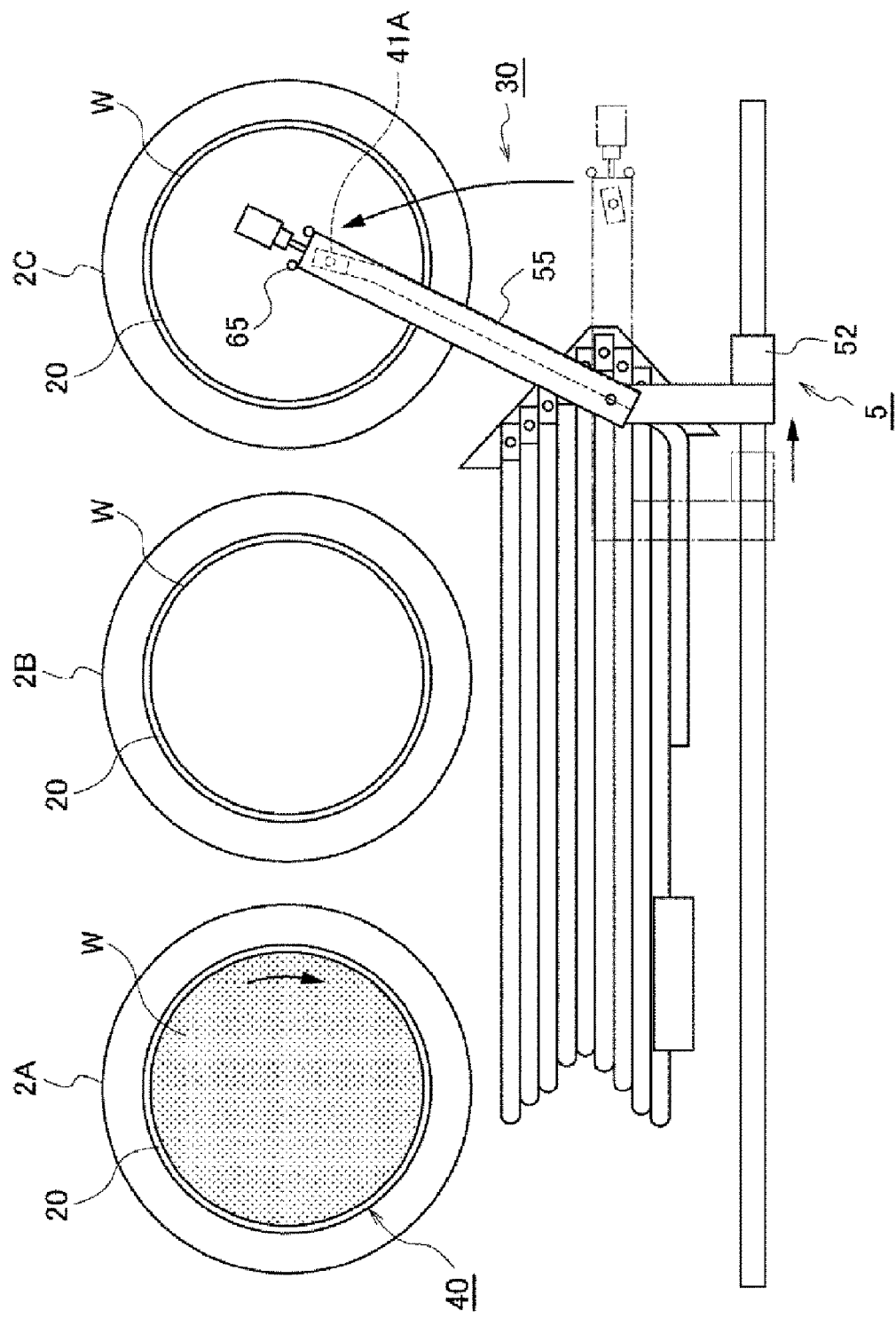
FIG. 15 is an explanatory diagram of an operation of the resist coating apparatus.

After the discharge of the resist liquid is stopped, the camera 64 captures an image and whether a liquid drips from the resist discharge nozzle 41A is determined. After the determination, the rotatable arm 55 is rotated clockwise when viewed from the plane and the resist discharge nozzle 41A is moved to the rear region 30 of the cups 2 (FIG. 13). During this rotation of the rotatable arm 55, the horizontal moving unit 52 is not moved in order for the discharge opening 49 of the resist discharge nozzle 41A not to pass above the opening 20 of the cup 2B. After the resist discharge nozzle 41A is positioned at the rear region 30, the horizontal moving unit 52 is moved toward a rear side of the cup 2C (FIG. 14). In order to suppress a contact between the rotatable arm 55 and the housing 11 of the apparatus 1 illustrated in FIG. 1, during this movement of the horizontal moving unit 52, the rotatable arm 55 starts rotating in the counterclockwise direction when viewed from the plane. Then, when the thinner discharge nozzle 65 is positioned above a central portion of the wafer W in the cup 2C, the rotation of the rotatable arm 55 and the movement of the horizontal moving unit 52 are stopped (FIG. 15). As a result, the discharge opening 49 of the resist discharge nozzle 41A is moved to above the opening 20 of the cup 2C from above the opening 20 of the cup 2A while bypassing the opening 20 of the cup 2B.

Figure 16:
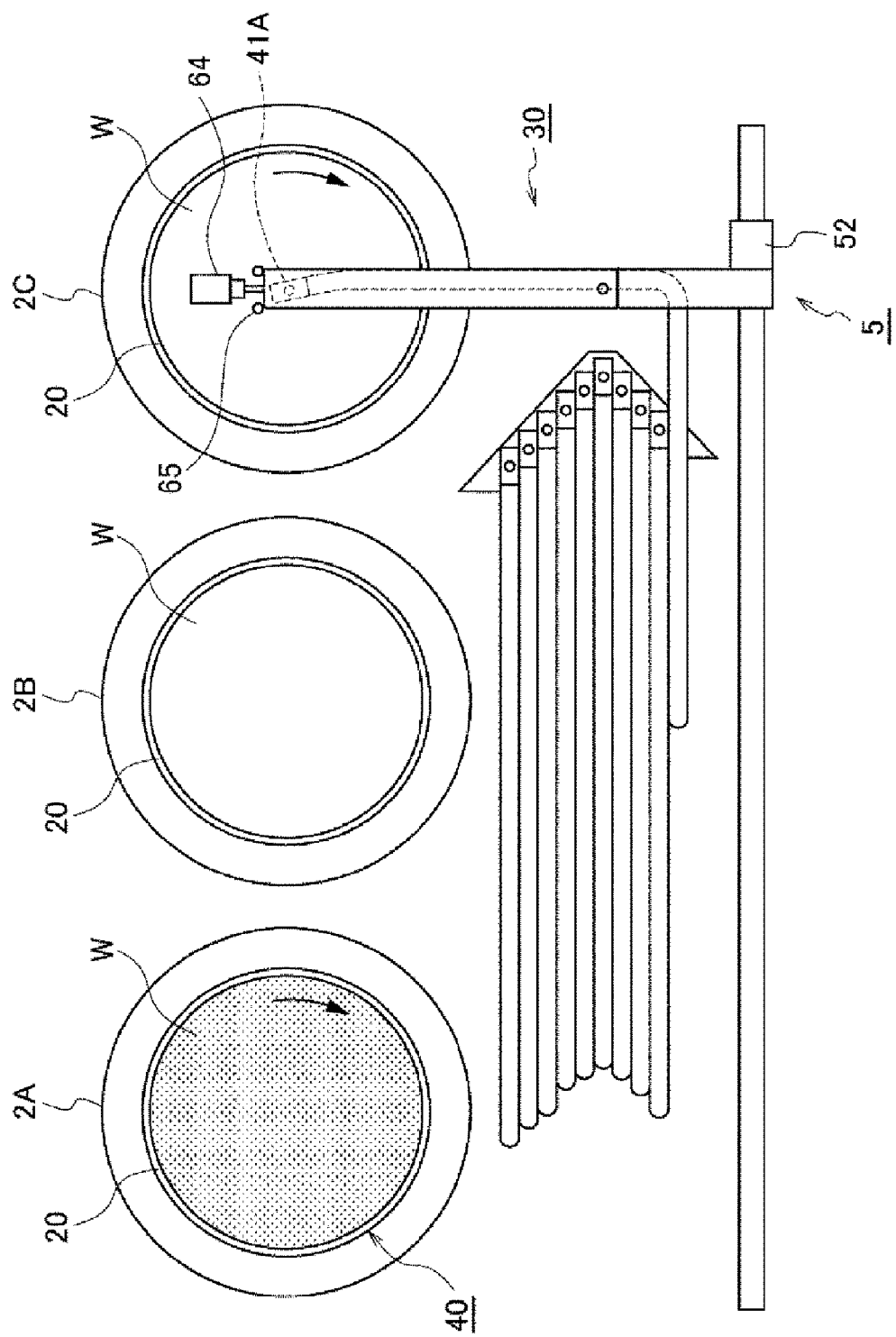
FIG. 16 is an explanatory diagram of an operation of the resist coating apparatus.

In the same manner as the process on the wafer W in the cup 2A, the thinner is supplied to the wafer W in the cup 2C and the wafer W is rotated. Then, the horizontal moving unit 52 is moved toward the cup 2C and the rotatable arm 55 is rotated counterclockwise when viewed from the plane. After the resist discharge nozzle 41A is positioned above the central portion of the wafer W, the movement of the horizontal moving unit 52 and the rotation of the rotatable arm 55 are stopped (FIG. 16). Thereafter, a resist liquid is discharged to the central portion of the wafer W, so that a resist film 40 is formed.

Figure 17:
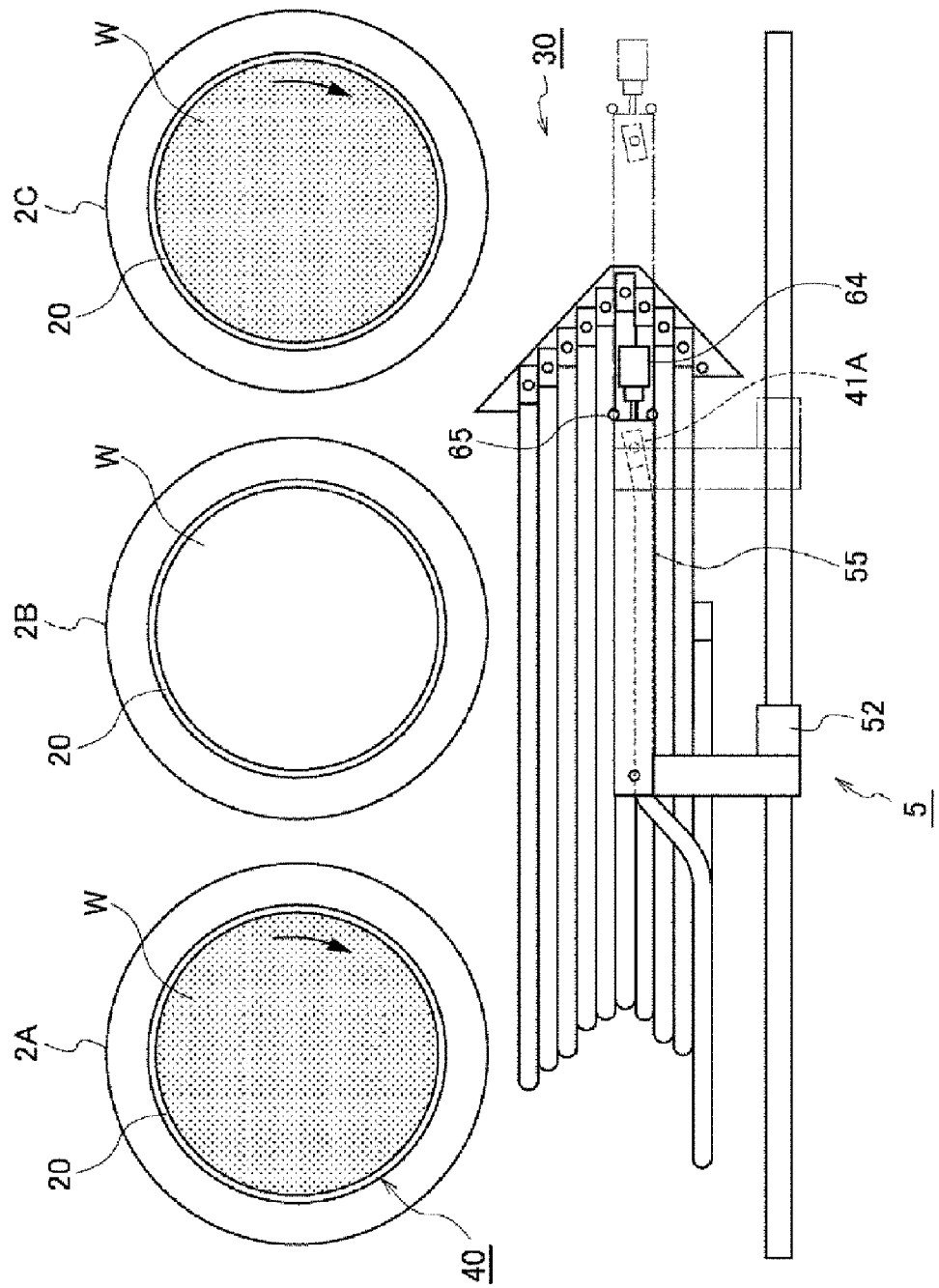
FIG. 17 is an explanatory diagram of an operation of the resist coating apparatus.

After the discharge of the resist liquid is stopped, the camera 64 captures an image and whether a liquid drips is determined. After the determination, while rotating the rotatable arm 55 clockwise when viewed from the plane, the horizontal moving unit 52 is moved toward the cup 2B. When the resist discharge nozzles 41 are positioned at the rear region 30, the rotation of the rotatable arm 55 is stopped. In order to perform a process on the wafer W in the cup 2B, the horizontal moving unit 52 is continuously moved toward the cup 2B. When the horizontal moving unit 52 is positioned at a certain position, the movement of the horizontal moving unit 52 is stopped (FIG. 17).

Figure 18:
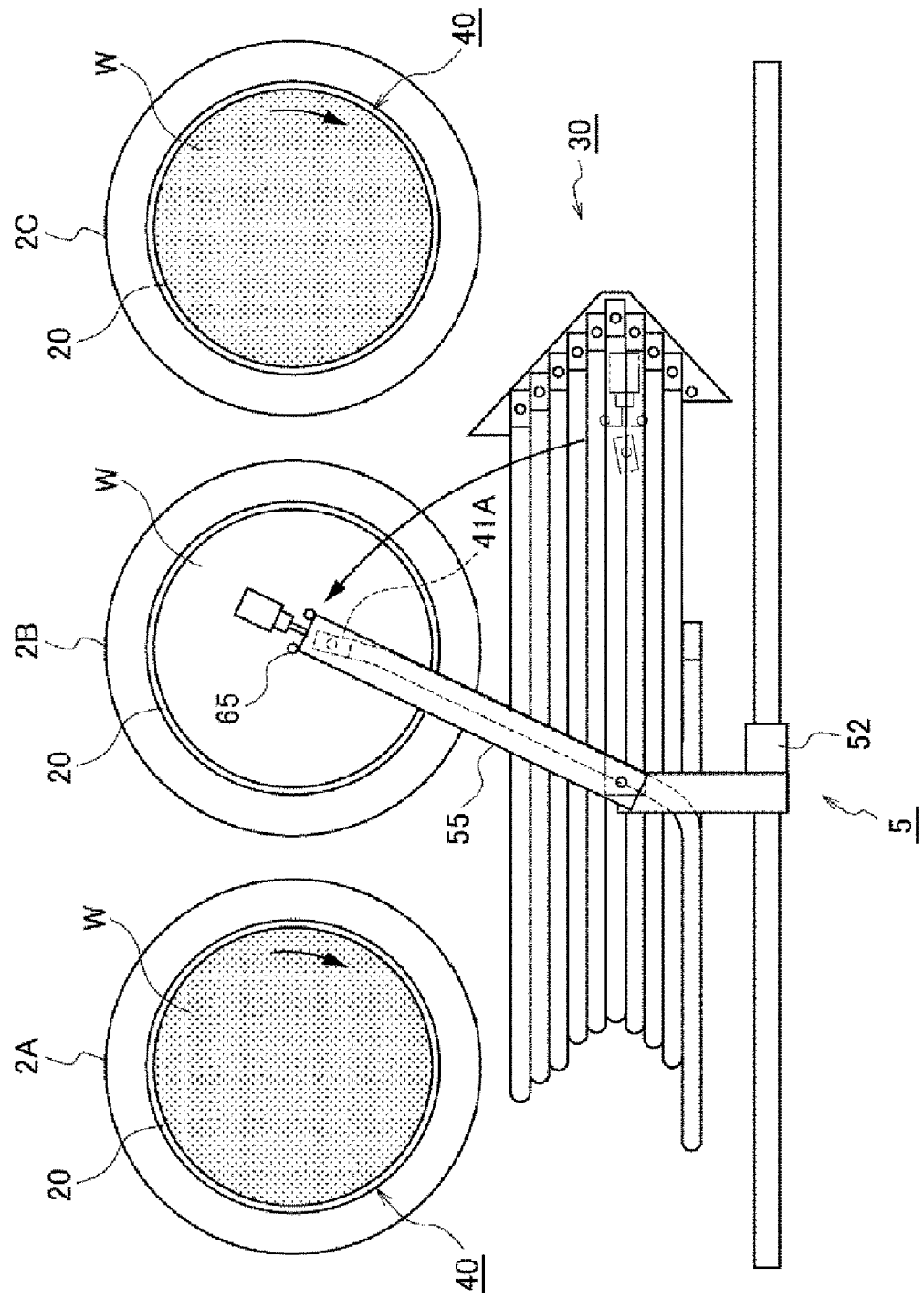
FIG. 18 is an explanatory diagram of an operation of the resist coating apparatus.
Figure 19:
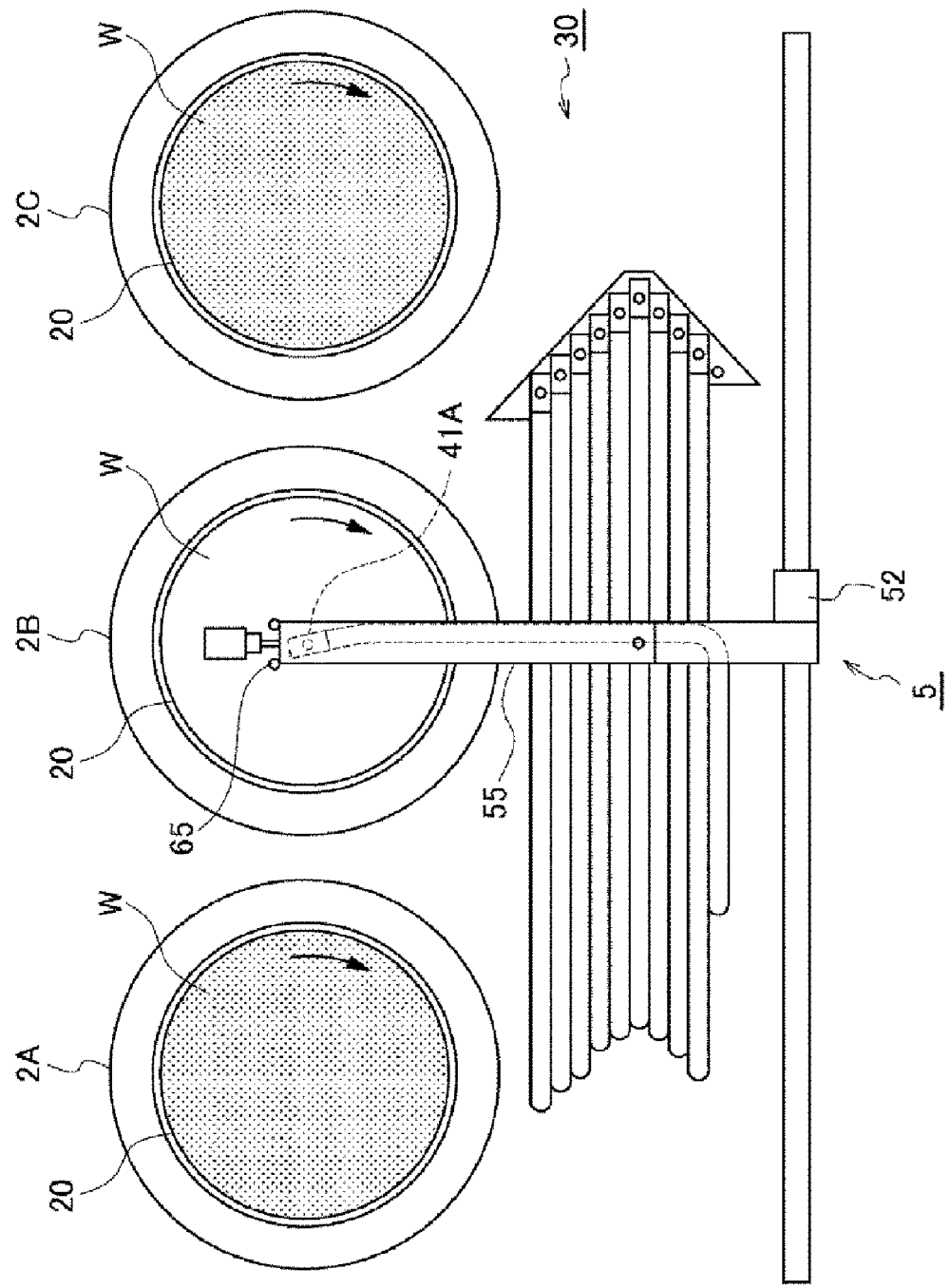
FIG. 19 is an explanatory diagram of an operation of the resist coating apparatus.

After rotating the rotatable arm 55 counterclockwise when viewed from the top, when the thinner discharge nozzle 65 is positioned above the central portion of the wafer W in the cup 2B, the rotation of the rotatable arm 55 is stopped (FIG. 18). In the same manner as the process on the wafers W in the cups 2A and 2C, the wafer W in the cup 2B is rotated and the thinner is discharged and coated on the wafer W. Then, the horizontal moving unit 52 is moved toward the cup 2C and the rotatable arm 55 is rotated counterclockwise. After the resist discharge nozzle 41A is positioned above the central portion of the wafer W, the movement of the horizontal moving unit 52 and the rotation of the rotatable arm 55 are stopped (FIG. 19). Thereafter, a resist liquid is discharged to the central portion of the wafer W, so that a resist film 40 is formed.

Figure 20:
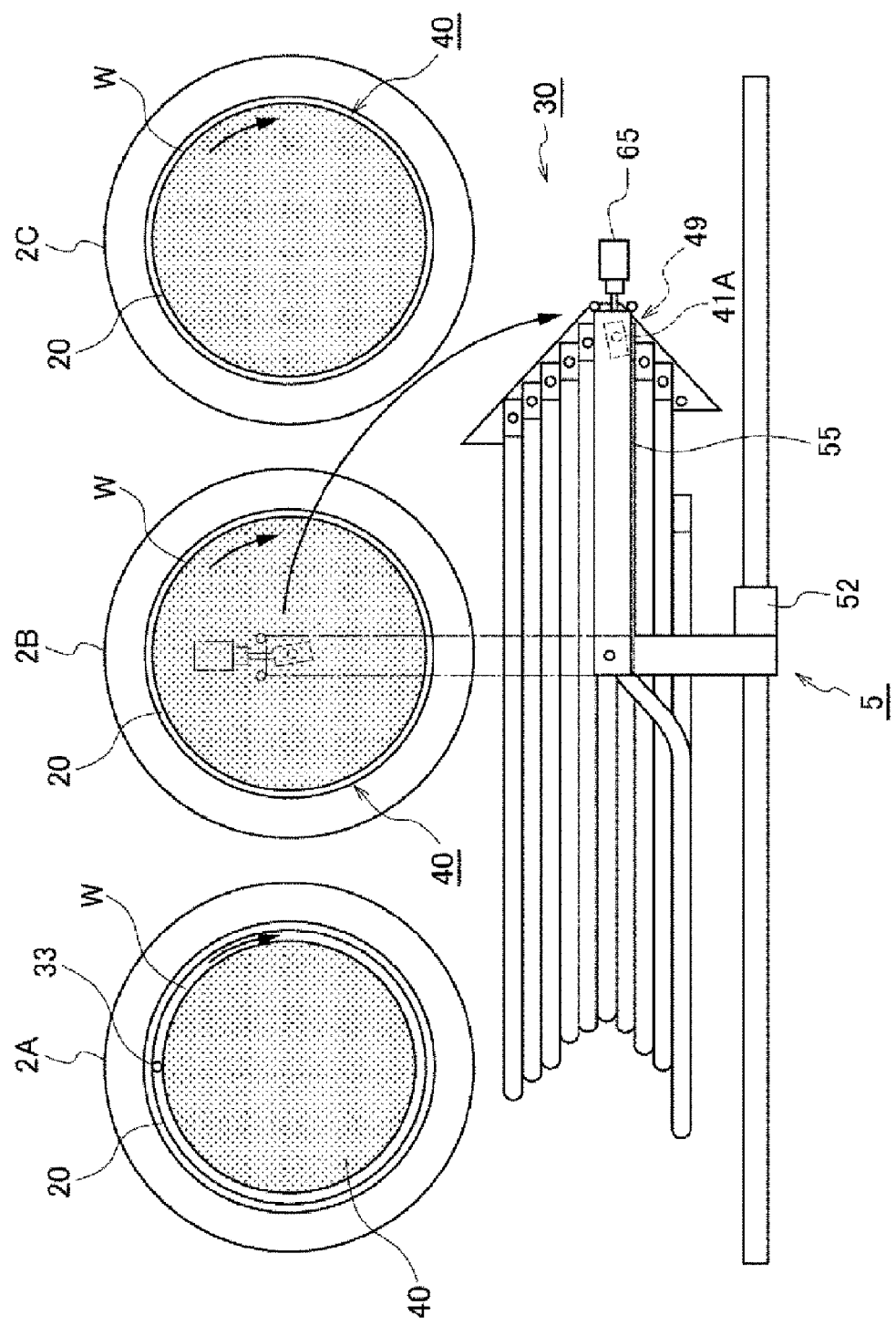
FIG. 20 is an explanatory diagram of an operation of the resist coating apparatus.

The camera 64 captures an image and whether a liquid drips from the resist discharge nozzle 41A is determined. After the determination, by rotating the rotatable arm 55 clockwise when viewed from the plane, the resist discharge nozzle 41A is retreated to the rear region 30 from above the opening 20 of the cup 2B to be on standby at the rear region 30 (FIG. 20). During the rotation of the rotatable arm 55, the horizontal moving unit 52 is not moved in order for the discharge opening 49 of the resist discharge nozzle 41A not to pass above the opening 20 of the cup 2C.

With the lapse of a certain period of time after the resist liquid is supplied, a thinner is supplied through the film removal nozzle 33 toward the peripheral portion of the wafer W, on which the resist film 40 has been formed, in each of the cups 2. As a result, the resist film is removed from the peripheral portion thereof. FIG. 20 illustrates a status where the resist film 40 is removed from the peripheral portion of the wafer W in the cup 2A as such. When the resist film 40 is removed from the peripheral portion of the wafer W, the rotation of the wafer W is stopped and the wafer W is unloaded from the resist coating apparatus 1 by the transfer device.

When a wafer W of a lot, in which a process is set to be performed by another resist discharge nozzle instead of the resist discharge nozzle 41A, is transferred to the resist coating apparatus 1, by the combination of the horizontal moving unit 52, the vertical moving unit 53, and the rotatable arm 55 of the nozzle transfer device 5, the front end 42 of the resist discharge nozzle 41A is inserted into the standby hole 31 of the nozzle standby unit 3 where the resist discharge nozzle 41A is originally on standby. Then, the engagement between the nozzle holding unit 57 of the rotatable arm 55 and the resist discharge nozzle 41 illustrated in FIG. 6 is released, and the resist discharge nozzle 41A is mounted on the nozzle standby unit 3. As a result, the resist discharge nozzle 41A is released from the rotatable arm 55. Thereafter, by the combination of the horizontal moving unit 52, the vertical moving unit 53, and the rotatable arm 55 of the nozzle transfer device 5, the another resist discharge nozzle is held by the rotatable arm 55 in the same manner as the case where the resist discharge nozzle 41A is held, and a process is performed on the wafer W of the lot.

There has been explained the case where it is determined that a liquid does not drip from the resist discharge nozzle 41A. On the other hand, if it is determined that a liquid drips, for example, the above-described process in the resist coating apparatus 1 is stopped. Further, the control unit 10 outputs an alarm indicating that the liquid drips to inform a user. The alarm may be, for example, a predetermined voice or a predetermined display.

According to the resist coating apparatus 1, the nozzle standby unit 3 is provided in the rear region 30 at the rear side of the cups 2, and the nozzle transfer device 5 transfers a nozzle selected from the resist discharge nozzles 41A to 41J between the nozzle standby unit 3 and the opening 20 of the each of the cups 2. The nozzle transfer device 5 transfers the resist discharge nozzle by moving the horizontal moving unit 52 along the left/right direction corresponding to the arrangement direction of the cups 2 and by rotating the rotatable arm 55 around the vertical rotation shaft 56 with respect to the horizontal moving unit 52. Thus, it is possible to suppress an increase in size of the apparatus 1 by suppressing a size along the arrangement direction of the cups 2. Further, as illustrated in FIG. 7 and FIG. 8, it is possible to suppress a decrease in life of the lines 44 connected to the resist discharge nozzles 41 by suppressing an increase in bending degree of the lines 44.

Further, after the resist coating process is performed on the wafer W in the cup 2A by the resist discharge nozzle 41, in order for the discharge opening 49 of the resist discharge nozzle 41 not to pass above the opening 20 of the adjacent cup 2B, the resist discharge nozzle 41 is transferred to above the opening 20 of the cup 2C through the rear region 30. Thus, even if a liquid drips from the resist discharge nozzle 41 while transferring the nozzle 41 to above the opening 20 of the cup 2C, it is possible to suppress the liquid from dripping on the wafer W in the cup 2B. Therefore, it is possible to control a production yield of products manufactured from the wafer W. In the resist coating apparatus 1, even when the resist discharge nozzle 41 is transferred from the cup 2C to the cup 2A, the resist discharge nozzle 41 is transferred such that the discharge opening 49 of the resist discharge nozzle 41 held by the rotatable arm 55 can bypass the cup 2B in the same manner as the case where the resist discharge nozzle 41 is transferred from the cup 2A to the cup 2C. In this example embodiment, the discharge opening 49 bypasses the opening 20 of the cup 2B, but the above-described effect can be obtained as long as the discharge opening 49 can bypass the wafer W of the cup 2B. Thus, the discharge opening 49 just needs to bypass the wafer W.

If the resist discharge nozzle 41 is transferred between the adjacent cups 2, the resist discharge nozzle 41 may not pass through the rear region 30 but may be transferred between the cups 2. That is, for example, if the resist discharge nozzle 41A is transferred from the cup 2C to the cup 2B during the above-described process, the discharge of the resist liquid to the wafer W in the cup 2C may be stopped, and then, the resist discharge nozzle 41A may be transferred to above the wafer W in the cup 2B without passing through the rear region 30.

It has been explained that when the resist discharge nozzle 41A is transferred to above the openings 20 of the cups 2A and 2B, while the movement of the horizontal moving unit 52 is stopped, the rotatable arm 55 is rotated. However, in the same manner as the case where the resist discharge nozzle 41A is transferred to above the opening 20 of the cup 2C, the rotation of the rotatable arm 55 may be carried out together with the movement of the horizontal moving unit 52.

Figure 21:
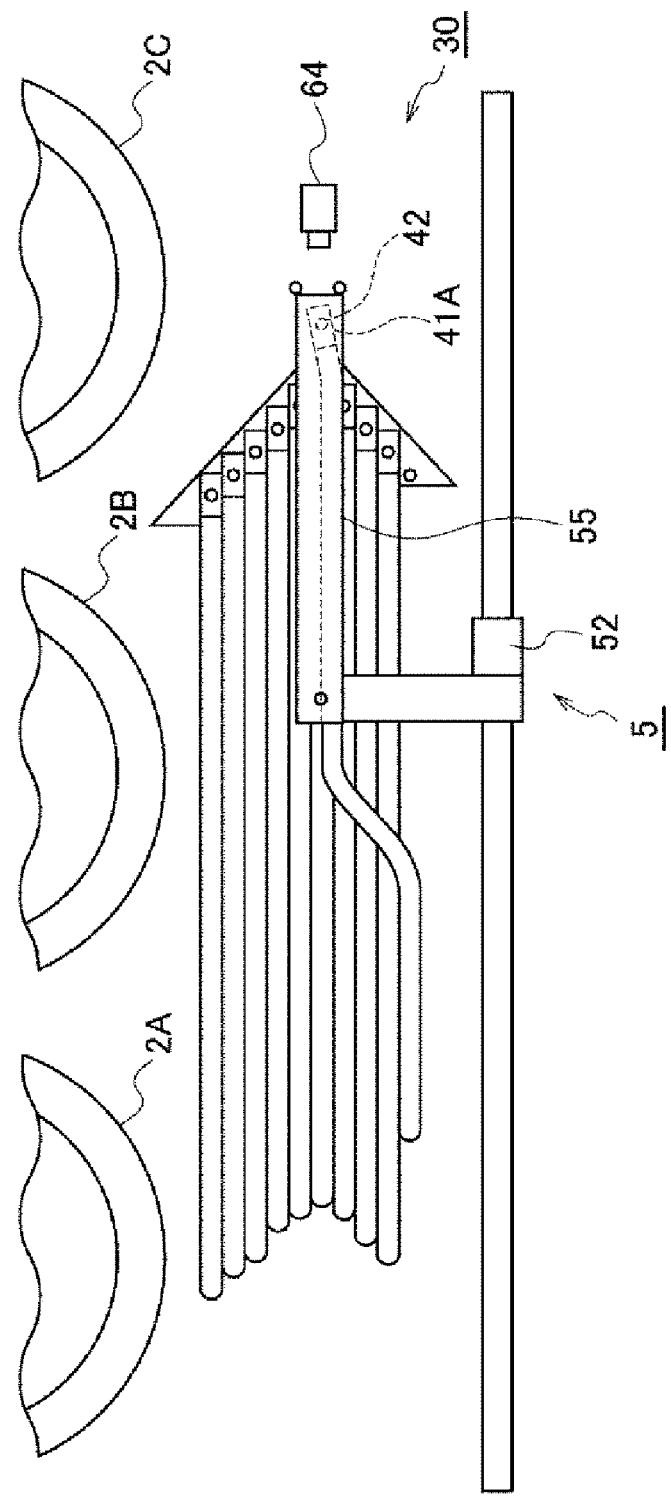
FIG. 21 is a plane view of a modification example of the resist coating apparatus.

In the above-described example embodiment, the camera 64 is provided at the nozzle transfer device 5 and moved together with the rotatable arm 55, but may not be limited thereto. FIG. 21 illustrates an example where the camera 64 is fixed at the rear region 30. When the resist liquid is discharged to the wafer W in one of the cups 2, as depicted in FIG. 21, the resist discharge nozzle 41 is transferred to a region where the camera 64 can capture an image, and an image of the front end 42 of the resist discharge nozzle 41 and a lower region thereof is captured. Then, the resist discharge nozzle 41 is transferred to the cup to be subsequently processed.

Figure 22:
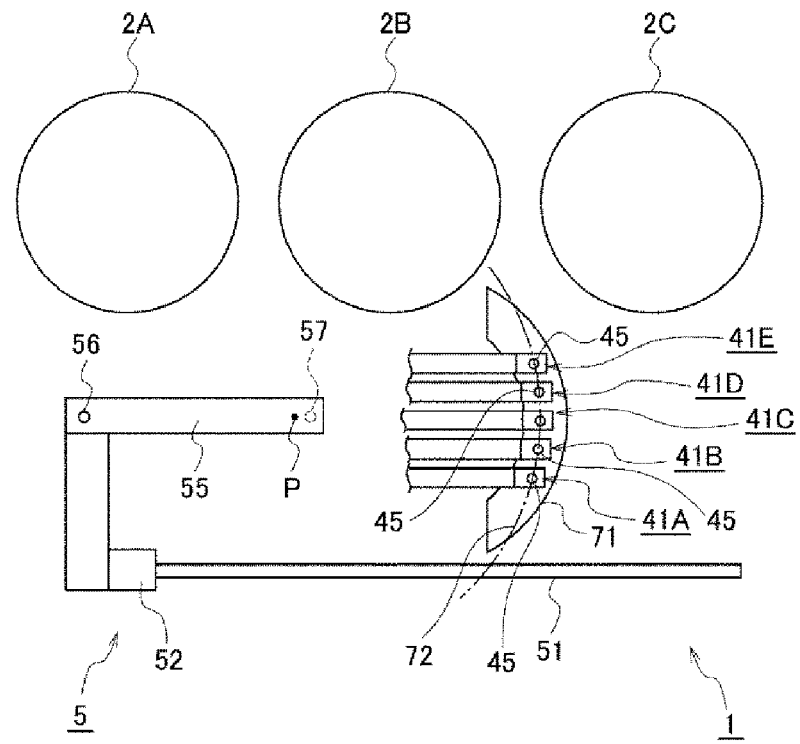
FIG. 22 is a schematic plane view of a modification example of the resist coating apparatus.

The nozzle standby unit 3 is not limited to the above-described shape as long as the nozzle transfer device 5 can receive the resist discharge nozzle 41. FIG. 22 illustrates a schematic diagram of the resist coating apparatus 1 including a nozzle standby unit 71 instead of the nozzle standby unit 3. The nozzle standby unit 71 has the same configuration as the nozzle standby unit 3 except its shape, and has a circular arc shape when viewed from the plane. On an upper surface of the nozzle standby unit 71, the standby holes 31 are arranged with a space from each other. In this example embodiment, the five resist discharge nozzles 41A to 41E are on standby at the nozzle standby unit 71.

While each of the resist discharge nozzles 41A to 41E is on standby at the nozzle standby unit 71, the transfer recesses 45 are arranged along a circular arc indicated by a dashed dotted line 72. The dashed dotted line 72 indicates a trajectory of the nozzle holding unit 57 caused by rotating the rotatable arm 55 around the rotation shaft 56 positioned at a point P in FIG. 22. That is, the resist discharge nozzles 41A to 41E are on standby such that the respective transfer recesses 45 are spaced apart at equal distances when viewed from the plane of the rotation shaft 56 positioned at the point P. Thus, the horizontal moving unit 52 can deliver each of the nozzles 41A to 41E at the same position without changing a position for each nozzle to be delivered.

In terms of design and maintenance of the apparatus, this configuration has the advantage that it is easy to check and adjust a position of the horizontal moving unit 52 when the nozzles are delivered. Like the nozzle standby unit 3, even when a nozzle standby unit has a V shape when viewed from the plane in the same manner as the nozzle standby unit 71, the standby holes 31 are formed such that the transfer recesses 45 can be arranged along the circular arc and the respective resist discharge nozzles 41 can be on standby.

Figure 23:
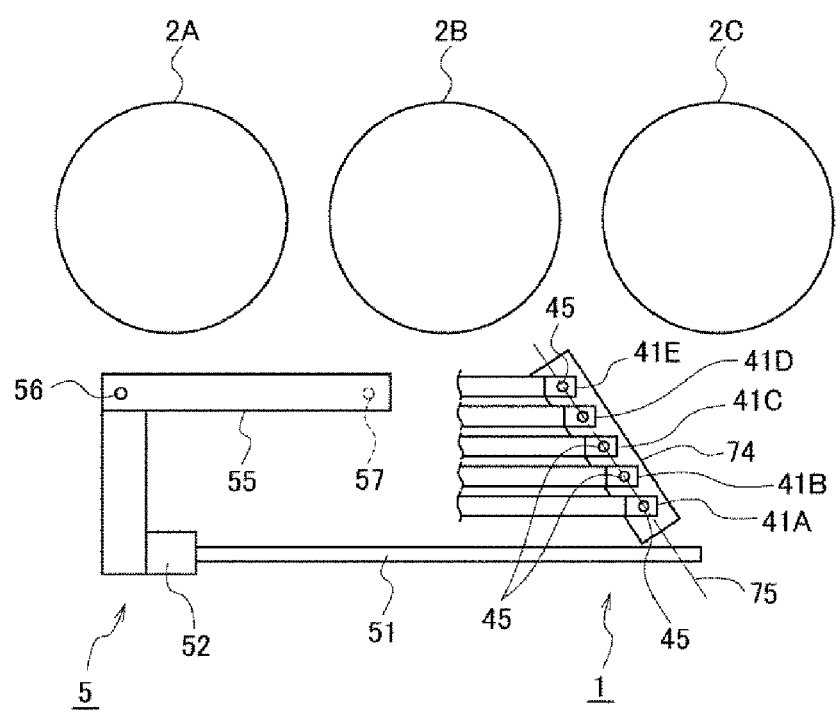
FIG. 23 is a schematic plane view of a modification example of the resist coating apparatus.
Figure 24:
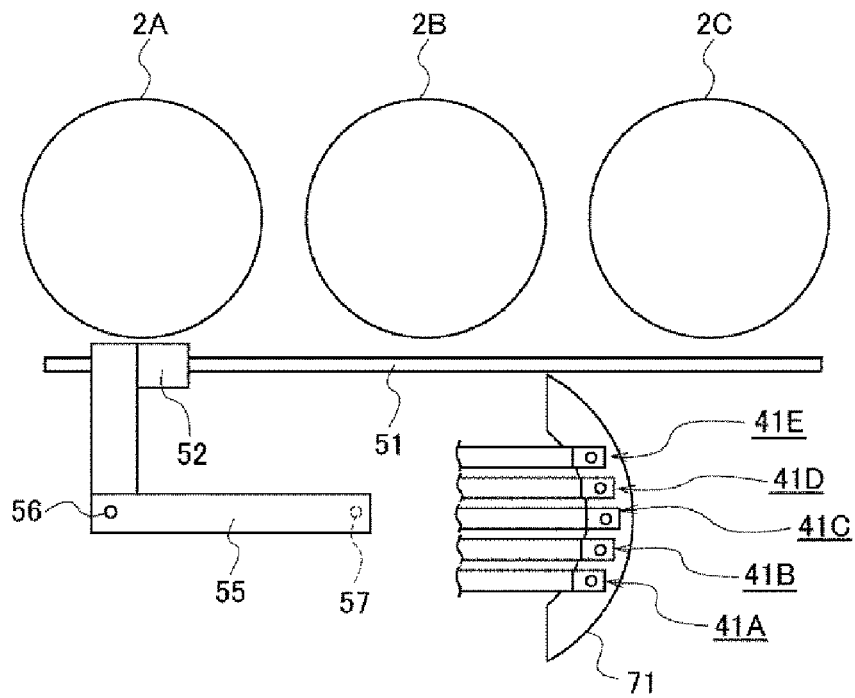
FIG. 24 is a schematic plane view of a modification example of the resist coating apparatus.

FIG. 23 illustrates a nozzle standby unit 74 as another example of the nozzle standby unit. The nozzle standby unit 74 has a straight line shape when viewed from the plane to be inclined from the cup 2B toward the cup 2C as going to the rear side of the apparatus 1 from the front side thereof. A dashed dotted line 75 in FIG. 23 indicates an arrangement direction of the resist discharge nozzles 41A to 41E on standby, and is identical with the lengthwise direction of the nozzle standby unit 74 in this example embodiment. Further, in each of the example embodiments, the guide rail 51 of the nozzle transfer device 5 is provided at a rear side of the nozzle standby unit, but may not be limited thereto. FIG. 24 illustrates an example where the nozzle standby unit 71 is arranged at a rear side of the guide rail 51.

Furthermore, in each of the example embodiments, at the resist discharge nozzle 41, the transfer recess 45 and the front ends 42 where the discharge openings 49 are formed are overlapped with each other when viewed from the top. However, the position of the transfer recess 45 is not limited thereto. In an example illustrated in FIG. 25, the long nozzle main body 43 made of a relatively hard material is formed in the horizontal direction, and the transfer recess 45 are formed at a position spaced apart from the front end 42 on standby at a nozzle standby unit 76 toward the flexible line 44.

Figure 25:
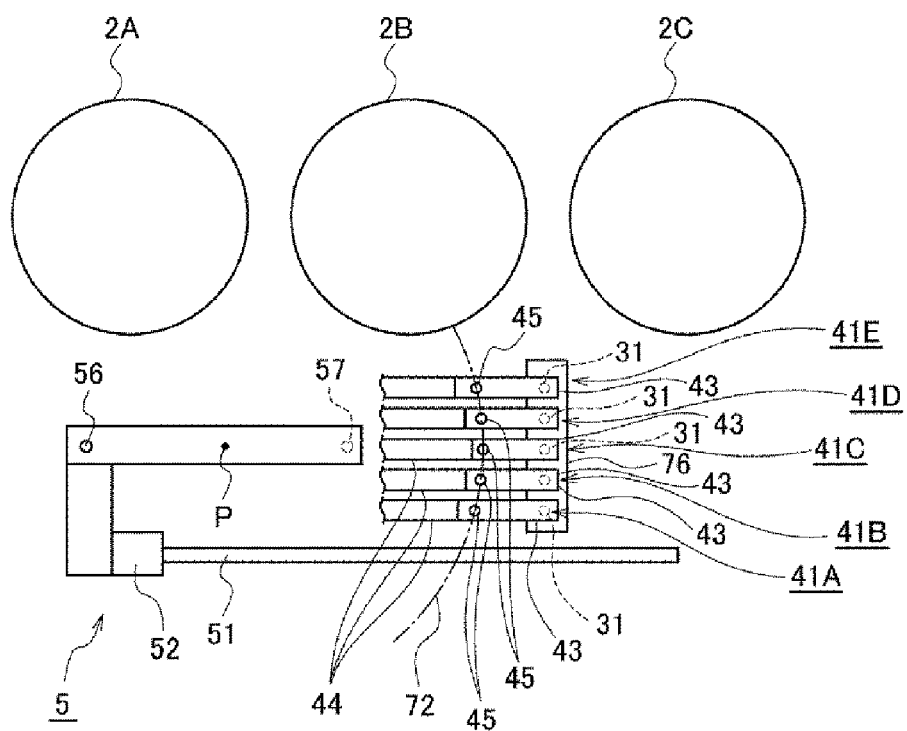
FIG. 25 is a schematic plane view of a modification example of the resist coating apparatus.

The nozzle standby unit 76 illustrated in FIG. 25 has a straight line shape extended in the forward/backward direction when viewed from the plane. The standby holes 31 are arranged along the lengthwise direction of the nozzle standby unit 76. While the resist discharge nozzles 41A to 41E are on standby at the nozzle standby unit 76, the transfer recesses 45 are arranged along the circular arc indicated by the dashed dotted line 72. Thus, in the same manner as the configuration example illustrated in FIG. 22, the rotatable arm 55 may deliver the resist discharge nozzles 41A to 41E to the nozzle standby unit 76 while the rotation shaft 56 is positioned at the point P.

Figure 26:
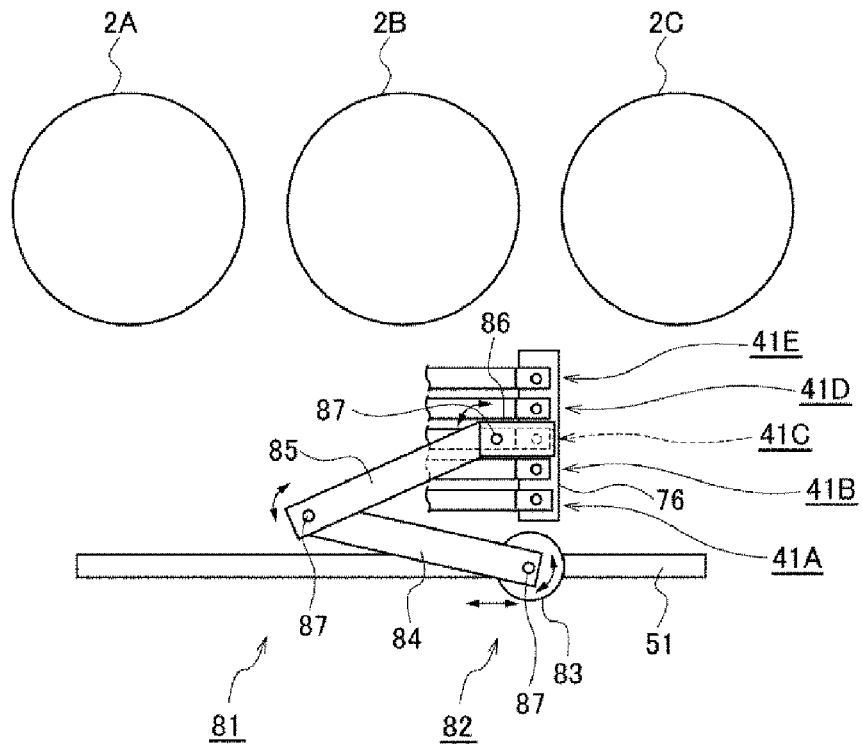
FIG. 26 is a schematic plane view of a modification example of the resist coating apparatus.
Figure 27:
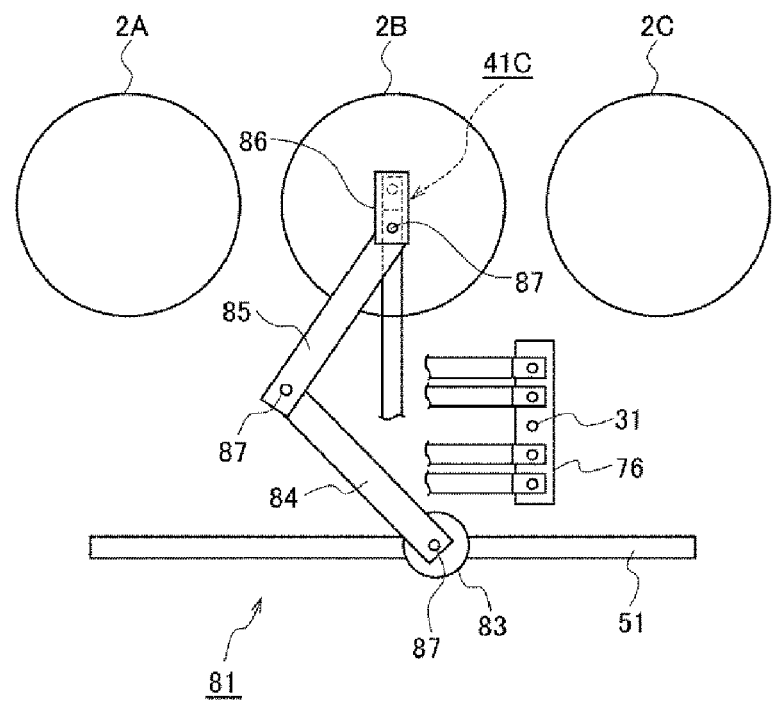
FIG. 27 is a schematic plane view of a modification example of the resist coating apparatus.

FIG. 26 and FIG. 27 illustrate a resist coating apparatus 81 including the nozzle standby unit 76. The resist coating apparatus 81 is different from the resist coating apparatus 1 in that a nozzle transfer device 82 is provided instead of the nozzle transfer device 5. The nozzle transfer device 82 includes the guide rail 51 and a transfer base unit 83. The transfer base unit 83 is configured to be moved along the guide rail 51 and vertically moved. A first arm 84 is extended from the transfer base unit 83 in the horizontal direction, a second arm 85 is extended from a front end of the first arm 84 in the horizontal direction, and a third arm 86 is extended from a front end of the second arm 85 in the horizontal direction. Further, the first arm 84, the second arm 85, and the third arm 86 are configured to be rotated around a vertical rotation shaft 87 with respect to the transfer base unit 83, the first arm 84, and the second arm 85, respectively.

The third arm 86 corresponds to the rotatable arm 55 of the nozzle transfer device 5, and includes the nozzle holding unit 57 (illustration of which is omitted) at a lower side thereof. The resist discharge nozzles 41A to 41E on the nozzle standby unit 76 can be transferred to above the wafer W of each of the cups 2 by rotating the first to third arms 84 to 86, and by horizontally moving and vertically moving the transfer base unit 83.

Figure 28:
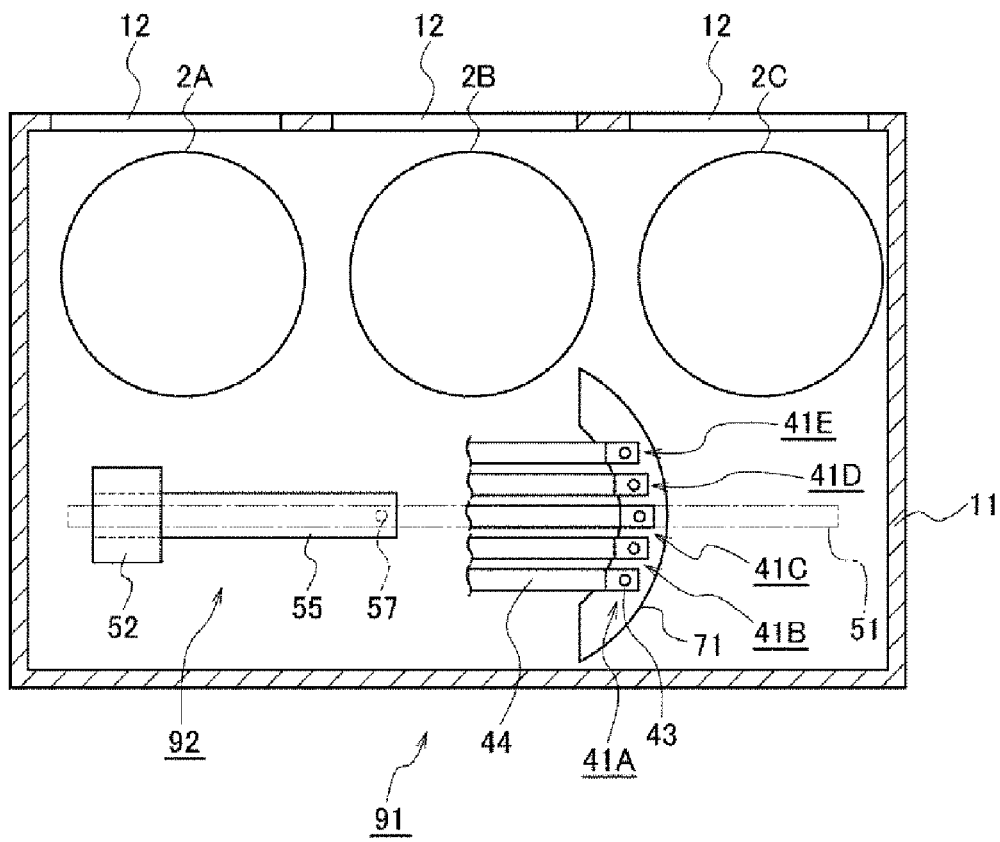
FIG. 28 is a schematic plane view of a modification example of the resist coating apparatus.
Figure 29:
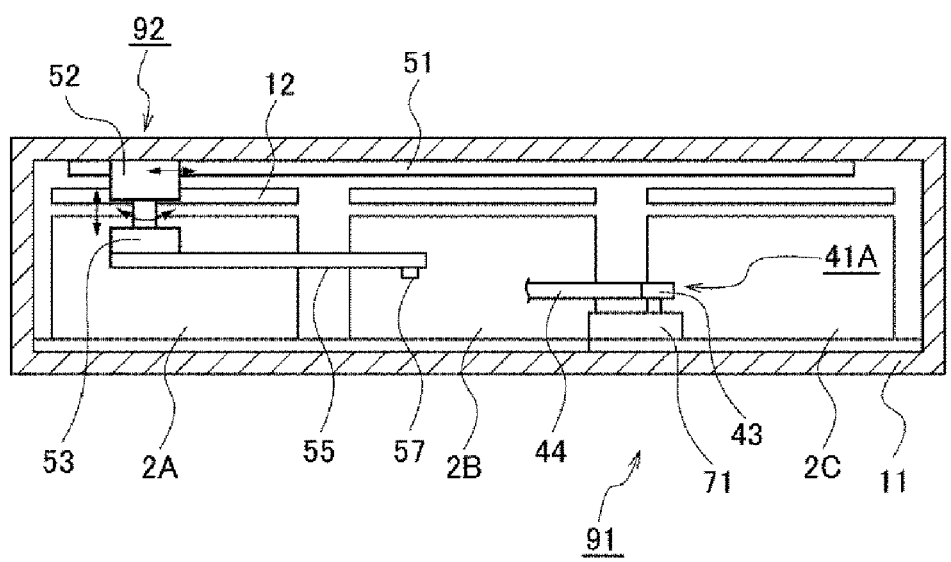
FIG. 29 is a schematic side view of a modification example of the resist coating apparatus.

FIG. 28 and FIG. 29 respectively illustrate a plane view and a side view of a resist coating apparatus 91. The resist coating apparatus 91 includes the nozzle standby unit 71 illustrated in FIG. 22. Further, the resist coating apparatus 91 includes a nozzle transfer device 92 instead of the nozzle transfer device 5. The nozzle transfer device 92 has substantially the same configuration as the nozzle transfer device 5, but the nozzle transfer device 92 is different from the nozzle transfer device 5 in that the guide rail 51 is provided at a ceiling surface of the housing 11. That is, the horizontal moving unit 52 moves along the ceiling surface of the housing 11. As depicted in FIG. 29, the vertical moving unit 53 is provided under the horizontal moving unit 52 and configured to be vertically moved with respect to the horizontal moving unit 52. Under the vertical moving unit 53, a base end of the rotatable arm 55 is provided to be rotated. The rotatable arm 55 can deliver each of the resist discharge nozzles 41A to 41E with respect to the nozzle standby unit 71 by the nozzle holding unit 57 provided at the front end of the rotatable arm 55.

Figure 30:
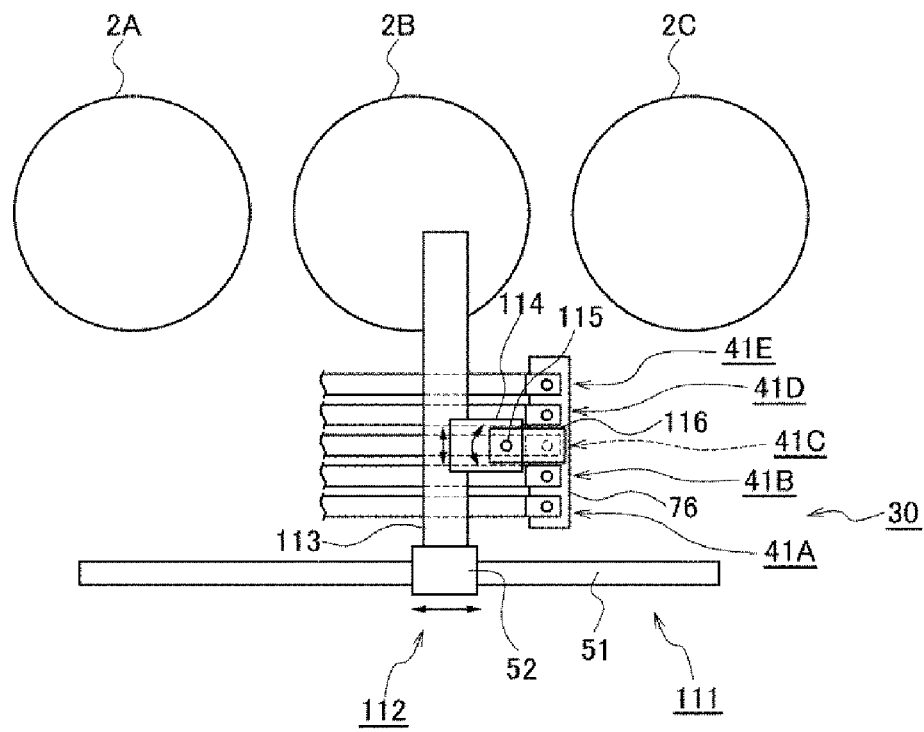
FIG. 30 is a schematic plane view of a modification example of the resist coating apparatus.
Figure 31:
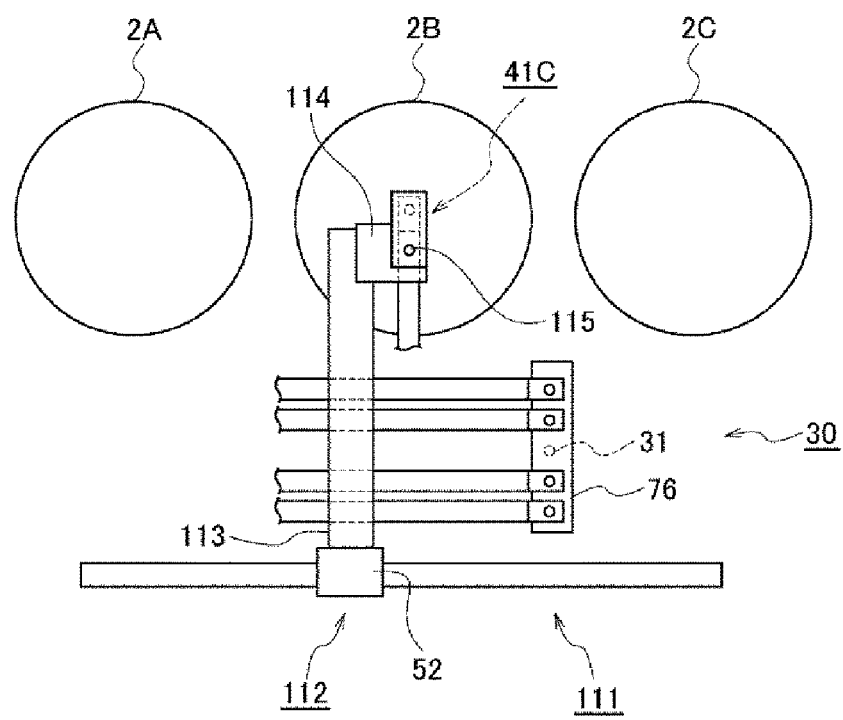
FIG. 31 is a schematic plane view of a modification example of the resist coating apparatus.

FIG. 30 and FIG. 31 illustrate a resist coating apparatus 111. In the resist coating apparatus 111, the nozzle standby unit 76 and a nozzle transfer device 112 are provided. The nozzle transfer device 112 includes the guide rail 51 and the horizontal moving unit 52. The horizontal moving unit 52 includes an arm 113 that is extended toward the front side (cups 2' side), and is configured to vertically move the arm 113. At the arm 113, there is provided a forward/backward moving unit 114 configured to be moved along a lengthwise direction of the arm 113. At the forward/backward moving unit 114, there is provided a rotatable arm 116 configured to be rotated around a vertical rotation shaft 115. The rotatable arm 116 corresponds to the rotatable arm 55 of the nozzle transfer device 5, and includes the nozzle holding unit 57 (illustration of which is omitted) at a lower side thereof. With this configuration, the rotatable arm 116 can transfer each of the resist discharge nozzles 41A to 41E on the nozzle standby unit 76 to each of the cups 2.

In the nozzle transfer device 112, for example, until the resist discharge nozzle 41 is replaced at the nozzle standby unit 76 after the resist discharge nozzle 41 is received, a direction of the rotatable arm 116 is maintained such that the received resist discharge nozzle 41 is positioned at a front side with respect to the rotation shaft 115 as depicted in FIG. 31. Therefore, unlike in the case of the resist coating apparatus 1, when a process is performed on the wafer W in the cup 2C subsequent to the wafer W in the cup 2A, the resist discharge nozzle 41 is transferred from the cup 2A to the cup 2C by bypassing the opening 20 of the cup 2B through the combination of the forward/backward moving unit 114 and the horizontal moving unit 52 without rotating the rotatable arm 116.

Figure 32:
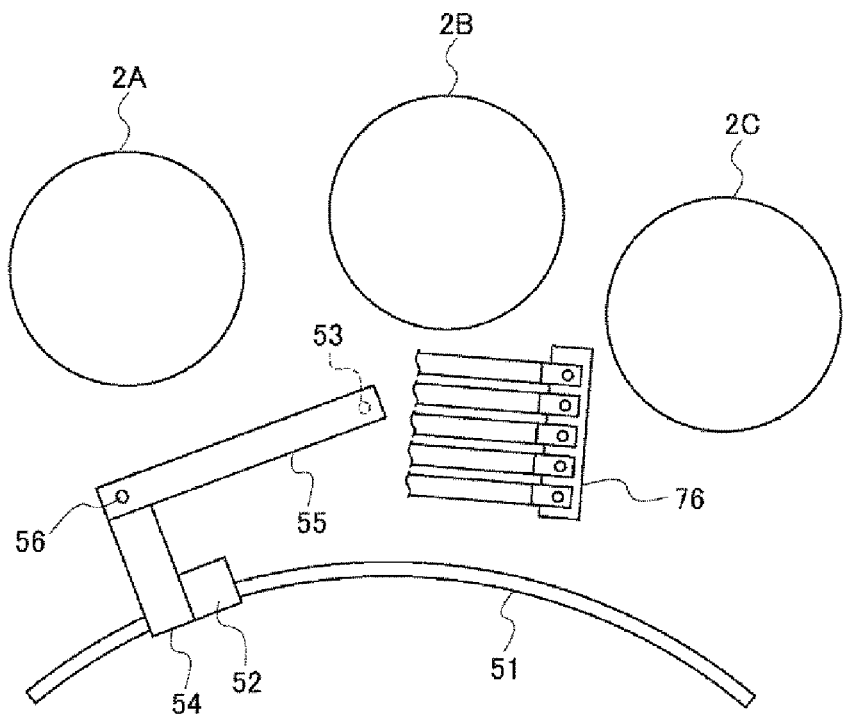
FIG. 32 is a schematic plane view of a modification example of the resist coating apparatus.

The cups 2 may not be arranged in a straight line shape, but may be arranged in a curve shape. FIG. 32 illustrates an example of the cups 2 arranged as such. In the example illustrated in FIG. 32, the guide rail 51 has a curve shape along this arrangement direction of the cups, but may have a straight line shape in the same manner as the above-described example embodiments as long as each of the resist discharge nozzles can be transferred between the nozzle standby unit 71 and each of the cups 2.

Figure 33:
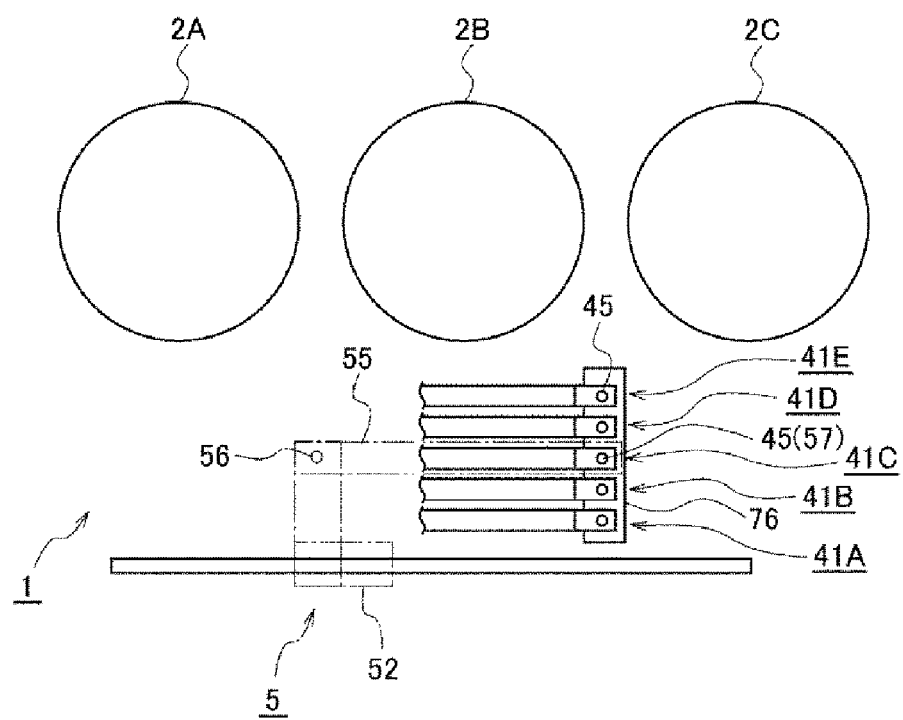
FIG. 33 is a schematic plane view of a modification example of the resist coating apparatus.
Figure 34:
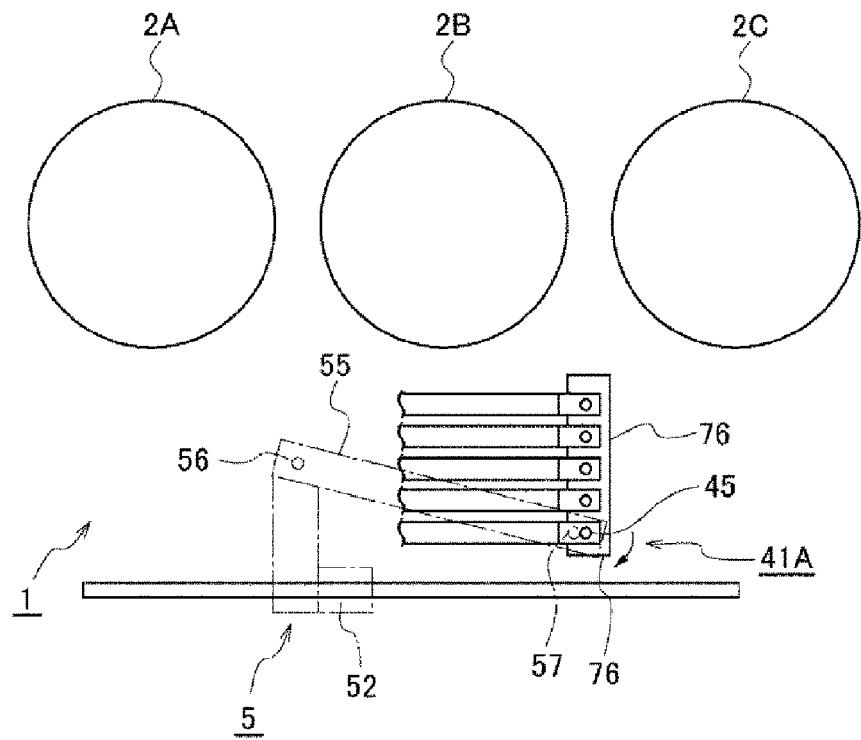
FIG. 34 is a schematic plane view of a modification example of the resist coating apparatus.
Figure 35:
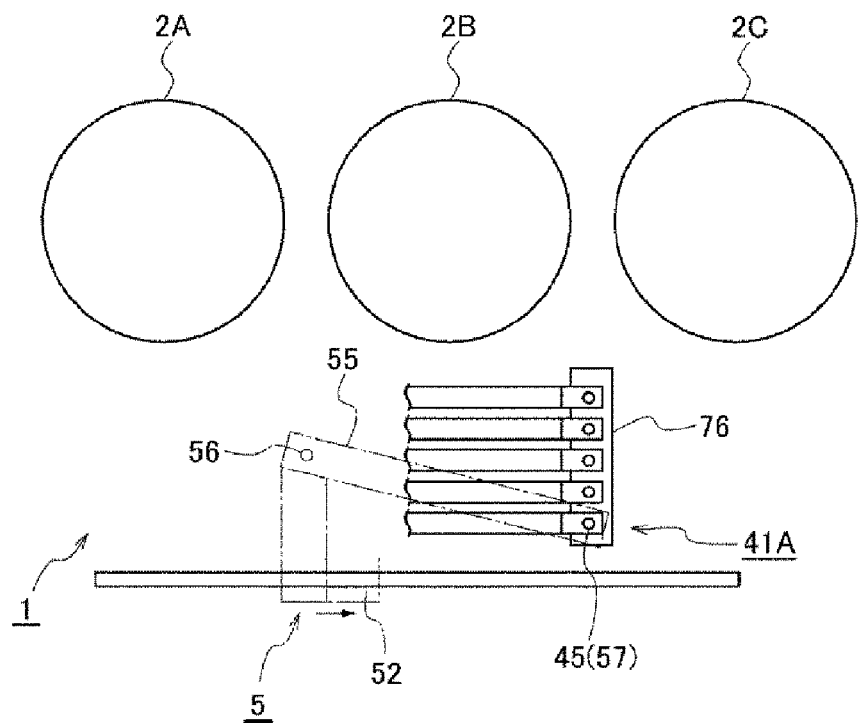
FIG. 35 is a schematic plane view of a modification example of the resist coating apparatus.

FIG. 33 also illustrates a configuration example of a resist coating apparatus in accordance with an example embodiment. The resist coating apparatus illustrated in FIG. 33 includes the nozzle standby unit 76 illustrated in FIG. 25 instead of the nozzle standby unit 3 of the resist coating apparatus 1. FIG. 33 shows positions of the rotatable arm 55 and the horizontal moving unit 52 when the resist discharge nozzle 41C is delivered to the nozzle standby unit 76. That is, the nozzle holding unit 57 is positioned to be overlapped with the transfer recess 45 of the resist discharge nozzle 41C. FIG. 34 illustrates a status where the rotatable arm 55 is rotated from the position illustrated in FIG. 33 in order to deliver the resist discharge nozzle 41A to the nozzle standby unit 76. FIG. 35 illustrates a status where the horizontal moving unit 52 is moved from the position illustrated in FIG. 33 and FIG. 34 in order to deliver the resist discharge nozzle 41A to the nozzle standby unit 76 and the nozzle holding unit 57 is overlapped with the transfer recess 45 of the resist discharge nozzle 41A.

A rotating direction of the rotatable arm 55 in FIG. 35 is the same as that of the rotatable arm 55 in FIG. 34. There has been explained the delivery of the resist discharge nozzles 41A and 41C as an example, but the other resist discharge nozzles are also delivered by adjusting the rotating direction of the rotatable arm 55 and the position of the horizontal moving unit 52. That is, in the resist coating apparatus 1 illustrated in FIG. 33 to FIG. 35, by the combination of the horizontal moving unit 52 and the rotatable arm 55, the nozzle holding unit 57 is moved to the transfer recess 45 of each of the resist discharge nozzle 41A to 41E on standby, and the nozzle transfer device 5 is configured to hold the respective resist discharge nozzles 41A to 41E.

Further, in each of the above-described example embodiments, three cups 2 are provided in the apparatus, but four or more cups 2 may be provided. Furthermore, only two cups 2 may be provided. A processing liquid to be supplied to the wafer W is not limited to a resist liquid, and may include, for example, a chemical liquid for forming an antireflection film, a chemical liquid for forming an insulating film, or a developing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:
1. A liquid processing apparatus comprising:
multiple substrate holding units each configured to horizontally hold a substrate and arranged in a left/right direction;
a nozzle transfer device that is provided to be spaced from an arrangement of the substrate holding units in a forward/backward direction, the nozzle transfer device including a horizontal moving unit configured to move the nozzle transfer device in the left/right direction;
a nozzle standby unit, provided between a movement path of the nozzle transfer device and the arrangement of the substrate holding units, at which at least one nozzle configured to supply a processing liquid to the substrate held by the substrate holding unit is on standby; and
a rotatable arm having one end at which a nozzle holding unit configured to detachably hold the at least one nozzle is installed and the other end rotatably provided at the horizontal moving unit,
wherein the at least one nozzle is transferred between the nozzle standby unit and a supply position where the processing liquid is supplied to the substrate together by the horizontal moving unit and the rotatable arm,
the at least one nozzle includes a plurality of nozzles,
the nozzles are on standby at the nozzle standby unit, and the nozzle holding unit is configured to hold the nozzle selected from the nozzles,
each of the nozzles includes a holding target portion into which the nozzle holding unit is introduced, and
the holding target portions of the nozzles on standby at the nozzle standby unit are arranged along a circular arc such that the holding target portions are spaced apart from a rotation shaft of the rotatable arm at equal distances when viewed from above the nozzle transfer device, when the nozzle transfer device is moved to a preset nozzle delivery position.

2. The liquid processing apparatus of claim 1, wherein at least one line configured to supply the processing liquid to the at least one nozzle is extended from the at least one nozzle on standby at the nozzle standby unit to be in parallel with the arrangement of the substrate holding units.

3. The liquid processing apparatus of claim 2, wherein the nozzle standby unit is fixed with respect to each of the substrate holding units.

4. The liquid processing apparatus of claim 1, further comprising, a control unit configured to output a control signal to control a rotating direction of the rotatable arm and a movement of the horizontal moving unit, wherein the number of the substrate holding units are three or more, and the control unit outputs the control signal such that the at least one nozzle is transferred to the substrate held by the first substrate holding unit from the substrate held by the second substrate holding unit by bypassing the substrate held by the third substrate holding unit provided between the first substrate holding unit and the second substrate holding unit.

5. The liquid processing apparatus of claim 1, wherein the horizontal moving unit includes an extendable arm configured to be moved between the movement path of the horizontal moving unit and the arrangement of the substrate holding units, and the other end of the rotatable arm is provided at the extendable arm.

6. A liquid processing method comprising:

moving a nozzle transfer device along a left/right direction by using a horizontal moving unit included in the nozzle transfer device, the nozzle transfer device being provided to be spaced apart from an arrangement of substrate holding units in a forward/backward direction, and the substrate holding units each holding a substrate and being arranged in the left/right direction;

allowing at least one nozzle including a plurality of nozzles configured to supply a processing liquid to the substrate held by the substrate holding unit to be on standby at a nozzle standby unit provided between a movement path of the nozzle transfer device and the arrangement of the substrate holding units;

detachably holding the nozzle selected from the plurality of nozzles by a nozzle holding unit provided at one end of a rotatable arm configured to be horizontally rotated, the other end of the rotatable arm being provided at the horizontal moving unit; and transferring the at least one nozzle between the nozzle standby unit and a supply position where the processing liquid is supplied to the substrate together by the movement of the horizontal moving unit and the rotation of the rotatable arm, wherein each of the nozzles includes a holding target portion into which the nozzle holding unit is introduced, and the holding target portions of the nozzles on standby at the nozzle standby unit are arranged along a circular arc such that the holding target portions are spaced apart from a rotation shaft of the rotatable arm at equal distances when viewed from above the nozzle transfer device, when the nozzle transfer device is moved to a preset nozzle delivery position.

7. The liquid processing method of claim 6, wherein the number of the substrate holding units are three or more, and the liquid processing method comprises:

transferring the at least one nozzle to the substrate held by the first substrate holding unit from the substrate held by the second substrate holding unit by bypassing the substrate held by the third substrate holding unit provided between the first substrate holding unit and the second substrate holding unit.

8. The liquid processing method of claim 6, wherein the moving unit includes an extendable arm configured to be moved between the movement path of the horizontal moving unit and the arrangement of the substrate holding units, and the other end of the rotatable arm is provided at the extendable arm, and the transferring of the at least one nozzle between the nozzle standby unit and a supply position where the processing liquid is supplied to the substrate includes moving the rotatable arm in the forward/backward direction by the extendable arm.

9. A computer-readable storage medium having stored thereon computer-executable instructions that, in response to execution, cause a liquid processing apparatus to perform a liquid processing method as claimed in claim 6.

* * * * *